US005410603A

United States Patent [19]

Ishiguro et al.

[11] Patent Number: 5,410,603

[45] Date of Patent: Apr. 25, 1995

[54] EFFECT ADDING APPARATUS

[75] Inventors: Shiro Ishiguro; Masatoshi Watanuki, both of Fussa; Toshiaki Kawanishi, Hiroshima; Kohtaro Hanzawa, Iruma; Hiroyuki Sasaki, Fussa; Jun Yoshino, Akishima, all of Japan

[73] Assignee: Casio Computer Co., Ltd., Tokyo, Japan

[21] Appl. No.: 913,581

[22] Filed: Jul. 14, 1992

[30] Foreign Application Priority Data

Jul. 19, 1991 [JP] Japan .................................. 3-204871
Aug. 28, 1991 [JP] Japan .................................. 3-216868

[51] Int. Cl.[6] .............................................. H03G 3/00

[52] U.S. Cl. ........................................ 381/61; 351/63; 84/626; 84/630

[58] Field of Search .................. 84/629, 630, 705-707, 84/626, 662, DIG. 26; 381/61, 63

[56] References Cited

U.S. PATENT DOCUMENTS 4,297,933 11/1981 Nishimoto .
4,472,993 9/1984 Futamase et al. .
4,554,857 11/1985 Nishimoto .
4,554,858 11/1985 Wachi et al. .
4,572,048 2/1986 Franz et al. .
4,864,625 9/1989 Hanzawa et al. .
4,920,850 5/1990 Matsumoto et al. .................. 84/626
4,998,281 3/1991 Sakata .
5,025,703 6/1991 Iba et al. .
5,091,951 2/1992 Ida et al. .............................. 84/630
5,119,712 6/1992 Kato ..................................... 84/626
5,257,313 10/1993 Fujishita et al. ...................... 381/63

FOREIGN PATENT DOCUMENTS

WO91/01033 1/1991 WIPO .

*Primary Examiner*—Forester W. Isen

*Attorney, Agent, or Firm*—Frishauf, Holtz, Goodman & Woodward

[57] ABSTRACT

When a plurality of effects are simultaneously applied to an input audio signal, a plurality of effect-algorithms each for applying solely an effect to the input signal are stored in a memory, and a plurality of combination-algorithms or combination-data which represent combinations of the effects and orders in which effects are applied to the input audio signal are stored in the memory. When one of the combination-algorithms or the combination-data is selected, effect-algorithms included in the selected combination-algorithm or combination-data are selectively read out from the memory. A program for applying effects in a predetermined combination and order is written by CPU based on the read out effect-algorithms and combination-algorithm or combination-data. Receiving the program, DSP successively applies effects to the input audio signal in accordance with the program. As a result, the present effector needs less memory capacity than the conventional effector in which a number of programs consisting of combinations of effect-algorithms are previously stored. A multi-effector comprised of a connection of a digital effect adding device and an analog effect adding device, is provided with a memory having a plurality of memory areas for storing audio signals. An input audio signal, an input signal to the analog effect adding device and an output signal of the digital effect adding device are stored in respective memory areas of the memory. Whether either of input signals is supplied to the digital effect adding device or whether the output signal of the digital effect adding device is input to the analog effect adding device or the output signal is output as a final signal are decided by operation of an externally operated switch. In this way, the order in which effects are applied can be altered independently of the connection of the above two effect adding devices.

11 Claims, 33 Drawing Sheets

FIG. 14

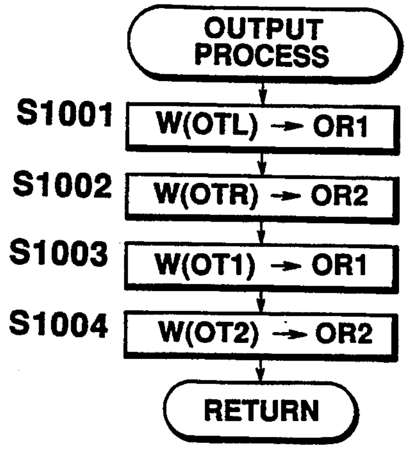

FIG. 15

| ADDRESSES | COEFFICIENTS | CONTENTS |
|---|---|---|
| 0 | W(INL) | L CHANNEL INPUT DATA |
| 1 | W(INR) | R CHANNEL INPUT DATA |
| 2 | W(INT) | T CHANNEL INPUT DATA |
| 3 | W(INE) | E CHANNEL INPUT DATA |
| 4 | W(EI1) | EFFECTOR1 INPUT CHANNEL DATA1 |
| 5 | W(EI2) | EFFECTOR1 INPUT CHANNEL DATA2 |
| 6 | W(EO1) | EFFECTOR1 OUTPUT CHANNEL DATA1 |
| 7 | W(EO2) | EFFECTOR1 OUTPUT CHANNEL DATA2 |
| 8 | W(FI1) | EFFECTOR2 INPUT CHANNEL DATA1 |
| 9 | W(FI2) | EFFECTOR2 INPUT CHANNEL DATA2 |
| 10 | W(FO1) | EFFECTOR2 OUTPUT CHANNEL DATA1 |
| 11 | W(FO2) | EFFECTOR2 OUTPUT CHANNEL DATA2 |
| 12 | W(OTL) | L CHANNEL OUTPUT DATA |
| 13 | W(OTR) | R CHANNEL OUTPUT DATA |
| 14 | W(OTT) | T CHANNEL OUTPUT DATA |
| 15 | W(OTE) | E CHANNEL OUTPUT DATA |
| 16 | W(OT1) | 1 CHANNEL OUTPUT DATA |
| 17 | W(OT2) | 2 CHANNEL OUTPUT DATA |

FIG.16(a)

| ADDRESSES | COEFFICIENTS | CONTENTS |
|---|---|---|
| 0 | P(EF1) | EFFECTOR1 OUTPUT MULTIPLYING COEFFICIENT |
| 1 | P(T) | T CHANNEL MULTIPLYING COEFFICIENT |
| 2 | P(PL1) | L CHANNEL MULTIPLYING COEFFICIENT |
| 3 | P(PLL1) | L CHANNEL MULTIPLYING COEFFICIENT |
| 4 | P(FL) | EFFECTOR2 OUTPUT MULTIPLYING COEFFICIENT |
| 5 | P(FR) | EFFECTOR2 OUTPUT MULTIPLYING COEFFICIENT |
| 6 | P(RR1) | R CHANNEL MULTIPLYING COEFFICIENT |
| 7 | P(RR) | R CHANNEL MULTIPLYING COEFFICIENT |

FIG.16(b)

| ADDRESSES | COEFFICIENTS | CONTENTS |
|---|---|---|
| 0 | P(LL2) | L CHANNEL MULTIPLYING COEFFICIENT |
| 1 | P(EL) | EFFECTOR1 OUTPUT MULTIPLYING COEFFICIENT |
| 2 | P(ER) | EFFECTOR1 OUTPUT MULTIPLYING COEFFICIENT |
| 3 | P(RR2) | R CHANNEL MULTIPLYING COEFFICIENT |
| 4 | P(E1) | E CHANNEL MULTIPLYING COEFFICIENT |
| 5 | P(F1) | EFFECTOR2 OUTPUT MULTIPLYING COEFFICIENT |
| 6 | P(F2) | EFFECTOR2 OUTPUT MULTIPLYING COEFFICIENT |
| 7 | P(T2) | T CHANNEL MULTIPLYING COEFFICIENT |

FIG.23

| | COEFFICIENTS | CONTENTS |
|---|---|---|
| 0 | PRAT | SAW-TOOTH WAVE RATE |
| 1 | PALK | ALL PASS FILTER COEFFICIENT |
| 2 | PALL | ALL PASS FILTER COEFFICIENT |
| 3 | PCOM | COMB FILTER COEFFICIENT |

FIG.24

| | COEFFICIENTS | CONTENTS |
|---|---|---|
| 0 | WINP | INPUT SIGNAL(ANALOG) |
| 1 | WINR | INPUT SIGNAL(DIGITAL) |
| 2 | WLFI | SAW-TOOTH WAVE RATE |
| 3 | WCCO | SAW-TOOTH WAVE RATE |
| 4 | WZRO | CONSTANT(ZERO) |
| 5 | WCC2 | CHORUS DELAYED OUTPUT |
| 6 | WCC3 | CHORUS OUTPUT |
| 7 | WDDO | DELAYED OUTPUT |
| 8 | WDD1 | DELAY OUTPUT |
| 9 | WALM | ALL PASS FILTER OUTPUT |
| 10 | WRVO | COMB FILTER A OUTPUT |
| 11 | WRV1 | COMB FILTER B OUTPUT |
| 12 | WRV2 | COMB FILTER C OUTPUT |
| 13 | WRV3 | REVERBERATION OUTPUT |

EFFECT ADDING APPARATUS

BACKGROUND OF THE INVENTION

1. Field of the Invention

The present invention relates to an effect adding apparatus which is capable of adding various sound effects to audio signals input from an electronic musical instrument and other audio equipment.

2. Description of the Related Art

In an electronic musical instrument and audio equipment which generate and process sounds, it has been an important theme how to generate musical tones of rich tone color. A conventional electronic musical instrument and audio equipment generate musical tones which are richer in sound effects with the aid of effector devices which add sound effects such as chorus, delay, reverberation effects and the like to the generated musical tones.

In recent, a so called multi-effector which is capable of simultaneously adding a plurality of sound effects to musical tones has been proposed and put in use in place of an effector which adds a single sound effect to musical tones.

The multi-effector includes a plurality of effectors which add a single sound effect to musical tones. The multi-effector is composed of a series connection of effectors or a parallel connection of effectors, or is composed of a digital signal processor (DSP), to which a program involving algorithms for performing various effect processes is sent to obtain a plurality of sound effects.

Furthermore, when the multi-effector is used as an effect adding device in an electronic musical instrument, the method of playing the musical instrument is changed to alter an atmosphere of musical tones to be generated, but lately some trials have been made to realize the above by changing a way to apply the sound effects to musical tones or changing the number of sound effects to be applied to the musical tones.

In the conventional effect adding device including a plurality of effectors, however, the physical connection of those effectors must be changed. But it will be easily understood that it is extremely hard to change the physical connection of the effectors while a performance of the musical instrument is being effected, and the effect adding device will not exhibit its features as the multi-effectors to a full extent. Usage of a switch may be also proposed for switching the connections of the effectors during the performance of the musical instrument, but a complicated circuitry arrangement will be invited for that purpose.

Meanwhile, when a user operates the multi-effector composed of DSP, he is simply required to change a program to be input thereto to obtain various sound effects, but a sufficient number of algorithms must be prepared in advance for executing various effect processes combined in different ways, and a central processing unit (CPU) consequently needs a large capacity of memory for storing the algorithms to be transferred to the DSP.

Some effects of superior features may be realized by an analog effect adding device using analog elements, rather than by the DSP executing a digital process. A distortion effect for distorting an input audio signal is one example of such effects. The reason why the analog effect adding device is preferably used in place of the digital effect adding device is that the analog effect adding device employs an analog element (for example, a diode) which is of a non-linear characteristic to add the distortion effect to an input signal while the digital effect adding device has inherently limited features to precisely exhibit the fine non-linear characteristic.

To include specific effects which will be expressed more efficiently by the analog effect adding device to the effects of the multi-effector, some trials have been made to generate musical tones of higher tone quality, in which an analog process is used to obtain specific effects and also digital processes are used to realize other effects. As a result, a multi-effector has been proposed which comprises a DSP for generating digital effects and an analog effect adding device for generating analog effects, both being physically connected with each other.

With the above structure of the multi-effector, however, an order of applying effects to a musical tone is limited by the physical connection of the DSP and the analog effect adding device, so that the order of application of sound effects to a musical tone can not be changed easily.

For example, when the distortion effect is added to a musical tone by the analog effect adding device and other effects are added by the DSP, and effects are added to tones in the order of reverberation, chorus, echo, and distortion effects, the analog effect adding device may be connected to the output of the DSP. To change the above order of the effects to such order as chorus, echo, distortion and reverberation effects, two units of DSPs must be prepared and an analog effect adding device are connected in series in the order of the DSP, the analog effect adding device and the DSP. The first DSP is arranged to execute the chorus and echo processes, and the following analog effect adding device executes the distortion effect, and finally the last DSP performs the reverberation effect.

With the above multi-effector including a connection of the analog effect adding device and the digital effect adding devices, the order of the physical connection of these two types of effect adding devices must be changed to alter the order of addition of various effects, which prevents the multi-effector from being used often and conveniently.

SUMMARY OF THE INVENTION

The present invention has been made to overcome the above drawbacks, and has an object to provide an effect adding apparatus which is capable of changing a combination of various effects which are applied to an input audio signal, requiring neither memory of a large capacity nor a change in circuitry connection.

According to one aspect of the invention, there is provided an effect adding apparatus which comprises:

effect-algorithm memory means for storing a plurality of effect-algorithms for applying sound effects to an input audio signal;

combination-algorithm memory means for storing a plurality of combination-algorithms for combining in different states the plurality of effect-algorithms stored in said effect-algorithm memory means;

algorithm combining means for reading out of the combination-algorithms from said combination-algorithm memory means, then selectively reading out effect-algorithms from said effect-algorithm memory means in accordance with the read out combination-algorithm, and combining the read out effect-algorithma in accordance with the read out combination-algorithm; and effect adding means for applying relevant sound effects to the input audio signal based on the effect-algorithms combined by said algorithm combining means.

The effect adding apparatus the above structure a change in combination of various sound effects to be applied to an input audio signal, without any restriction. There is no need in the effect adding apparatus to memorize as programs all of algorithms representative of all combinations of sound effects but only algorithms representative of respective sound effects and their combination are required to be memorized, resulting in a remarkable decrease in capacity of memory. Since the effect adding apparatus includes no connection of a plurality of hardware effectors, a user of the apparatus is not required to operate the apparatus to change a connection of the effectors while he is performing a musical instrument. The effect adding apparatus has no such drawback that includes a complex wiring connection.

The present invention has another object to provide an effect adding apparatus which comprises a multi-effector including a connection of an analog effect adding device and a digital effect adding device, and is capable of altering, with no restriction, an order of various effects to be applied to an audio signal without changing the wiring connection of the effect adding devices.

According to another respect of the present invention, there is provided an effect adding apparatus which comprises:

analog-effect adding means for .applying a sound effect to an input audio signal using an analog element;

input memory means having a plurality of memory areas, for storing the input audio signal and a signal output from said analog-effect adding means in relevant memory areas respectively;

digital-effect adding means for applying through a digital process a sound effect to the signal stored in either of the memory areas of said input memory means;

output memory means having a memory area for storing the signal output from said digital-effect adding means as an input signal to said analog-effect adding means and having a memory area for storing the signal output from said digital-effect adding means as a final output signal; and.

designating means for designating a memory area in said input memory means where a signal to be input to said digital-effect adding means is stored, and designating a memory area in said output memory means where the signal output from said digital-effect adding means is to be stored.

With the effect adding apparatus of the above structure, an order of application to an input signal of sound effects to be realized in analog processes and sound effects to be realized in digital processes can be altered without changing a wiring connection of analog effect adding devices and digital effect adding devices.

Still another object of the present invention is to provide an effect adding apparatus which is capable of altering an order of application of various sound effects to an audio signal and a combination of these sound effects without requiring a large capacity of memory and without changing a circuitry connection.

According to still another aspect of the present invention, there is provided an effect adding apparatus which comprises:

effect-algorithm memory means for storing a plurality of effect-algorithms for applying different sound effects to an input audio signal;

combination-data memory means for storing a plurality of combination-data which represent combinations in different states of a plurality of effect-algorithms stored in said effect-algorithm memory means;

algorithm combining means for reading out a combination-data from said combination-data memory means, then selectively reading out relevant effect-algorithms from said effect-algorithm memory means in accordance with the read out combination-data, and combining the read out effect-algorithms; and effect adding means for applying relevant sound effects to the input audio signal in accordance with the effect-algorithm combined by said algorithm combining means.

With the effect adding apparatus of the above structure, an order of application of a plurality of sound effects to an input audio signal and a combination of these sound effects can be changed without any restriction. In the effect adding apparatus, since there is no need to memorize all algorithms representative of the combinations of the sound effects but algorithms representative of respective sound effects and combination data for indicating combinations of sound effects are memorized, a required capacity of memory can be decreased remarkably. Since the effect adding apparatus does not include a connection of a plurality of hardware effectors, the user of the apparatus is not required to operate to alter the connection of the effectors during his performance of an musical instrument. The effect adding apparatus is simple a wiring connection and allows the user to alter the order of application of sound effects to an input signal and the combination of the sound effects without any restriction.

Further, the present invention has yet another object to provide an effect adding apparatus which is a multi-effector comprising a connection of analog effect adding devices and digital effect devices, and is capable of altering an order of application of sound effects to a signal and a combination of these sound effects without changing a wiring connection.

According a yet another aspect of the invention, there is provided an effect adding apparatus which comprises:

effect-algorithm memory means for storing a plurality of effect-algorithms for applying different digital sound effects to an input audio signal;

analog-effect adding means for applying an analog effect to an input audio signal using an analog element;

combination-data memory means for storing a plurality of combination-data which represent combinations in different states of effect-algorithms and analog effect, the effect-algorithms being stored in said effect-algorithm memory means and the analog effect being applied to the input audio signal by said analog-effect adding means;

program writing means for reading out a combination-data from said combination-data memory means, then selectively reading out relevant effect-algorithms from said effect-algorithm memory mean in accordance with the read out combination-data, and writing a program representative of an order in which the digital effects based on the read out effect-algorithms and the analog effects by said analog-effect adding means are added;

signal memory means for storing the input audio signal;

digital-effect adding means for applying relevant digital sound-effects to the audio signal stored in said signal memory means when an application of the digital sound-effects based on the effect-algorithm is instructed in accordance with the program written by said program writing means;

control means for inputting the audio signal stored in said signal memory means to said analog-effect adding means and allowing an output signal of said analog-effect adding means to be stored again in said signal memory means, when an application of the analog effect is instructed in accordance with the program written by said program writing; and output means for outputting the audio signal stored in said signal memory means upon detection of completion of an application of the sound-effects to the audio signal in accordance with the program.

With the effect adding apparatus of the above structure, not only an order of application to an input signal of sound effects to be realized in analog processes and sound effects to be realized in digital processes can be altered without changing a wiring connection of analog effect adding devices and digital effect adding devices, but also a combination of the sound effects can be altered with a .limited capacity of memory.

BRIEF DESCRIPTION OF THE DRAWINGS

Other objects and features of the present invention will be more fully understood by those with skill in the art from the following description of the preferred embodiments and the accompanying drawings.

FIG. 14 is a flow chart showing a detailed operation of an output process in the first embodiment;

FIG. 15 is a view showing data used in the first embodiment;

FIGS. 16*a*–16*b* is a view showing coefficients used in the first embodiment;

FIG. 23 is a view showing filter coefficients to be stored in a coefficient memory (P) of FIG. 22;

FIG. 24 is a view showing various data to be stored in a work memory (W) of FIG. 22;

DETAILED DESCRIPTION OF THE PREFERRED EMBODIMENTS

Now, the first embodiment of the present invention will be described referring to the accompanying drawings.

Figure 1:
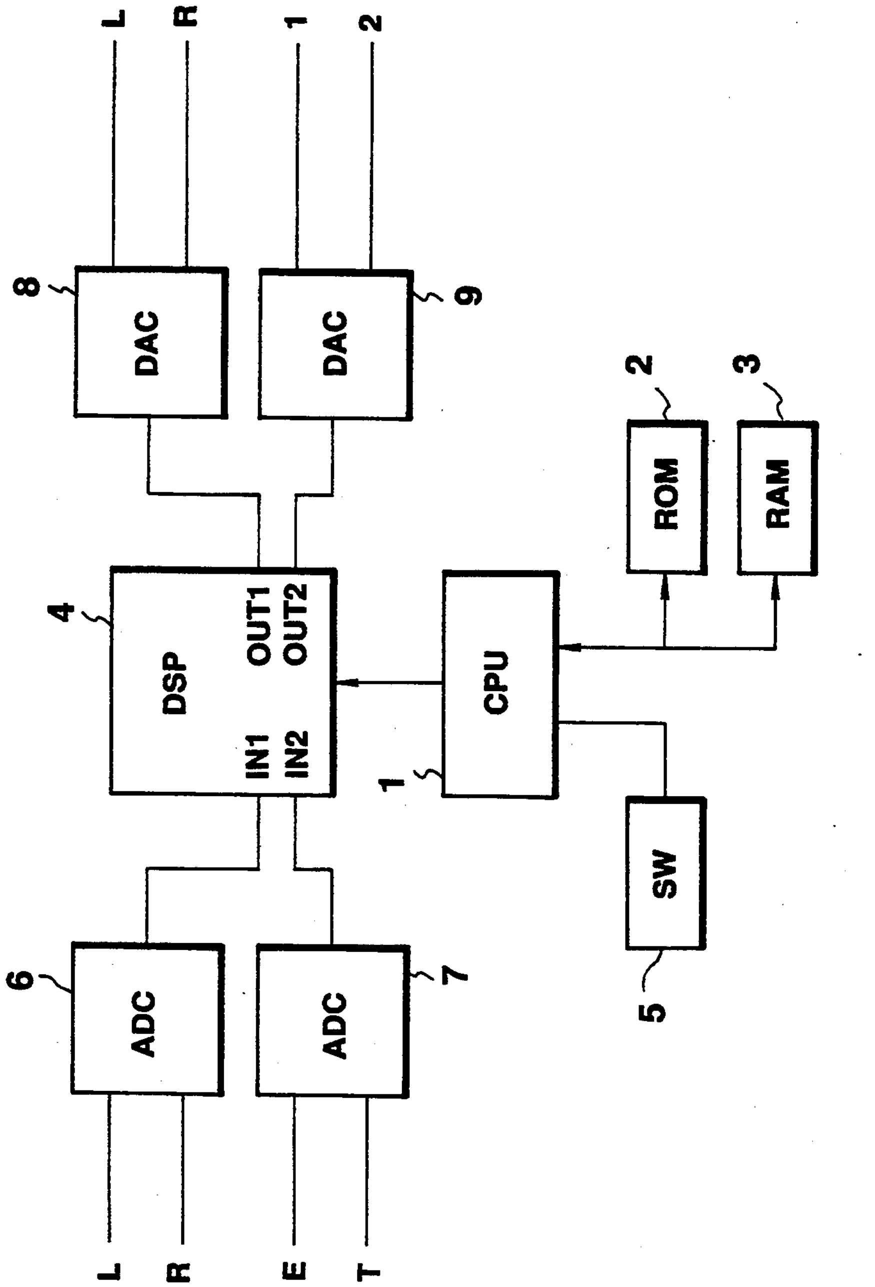
FIG. 1 is a general circuit diagram of a first embodiment of an effect adding apparatus according to the present invention.

FIG. 1 is a view showing a general circuit diagram of the first embodiment of an effect adding apparatus according to the present invention which is applied to an electronic musical instrument. In FIG. 1, a reference numeral 1 stands for a central processing unit (CPU), which is a means for writing a program. CPU 1 uses RAM 3 as a work memory and controls a digital signal processor (DSP) 4 in accordance with a program stored in ROM 2. CPU 1 refers to a state of various switches provided in a switch section 5, and performs a control operation in accordance with changes in the state of the switches.

ROM 2 functions as an effect-algorithm memory means as well as a combination-algorithm memory means, and previously stores these algorithms. The effect-algorithm is an algorithm for adding or applying a predetermined sound effect such as an echo effect and reverberation effect to an input audio signal. The effect algorithm for applying a plurality of sound effects includes algorithms which correspond to various sound effects respectively.

The combination-algorithm is an algorithm for selecting and combining in different forms a plurality of sound effects such as a chorus effect and the reverberation effect to be applied or added to an input signal.

The switches provided in the switch section 5 are operated to select one or a plurality of sound effects, and to select an appropriate form of combination of these sound effects. When one of the switches is operated, a control signal is sent to CPU 1 and CPU 1 allows a sound effect corresponding to the operated switch to be applied to an input audio signal.

When two switches are operated, a control signal is sent to CPU 1 and CPU 1 allows two sound effects corresponding to the operated switches respectively to be applied to an input audio signal with a desired order of their application. Further, the switches may be also operated such that one or two of the sound effects are applied to a plurality of channels of audio signals.

CPU 1 judges a form of combination of a plurality of sound effects to be applied to an input audio signal, based on the control signal sent from various switches provided in the switch section 5, and CPU 1 reads out effect-algorithms and a combination-algorithm from ROM 2 in accordance with the read out of the form of combination and writes a program based on these read out effect-algorithms and combination-algorithm. Then, the program is transferred to DSP 4.

DSP 4 executes a predetermined set of operation programs and applies a plurality of sound effects to a digital audio signal (such as a reproduced audio signal, hereafter, referred to as a musical-tone signal) to which an audio signal output from an electronic musical instrument (or from an audio reproducing apparatus) is converted by analog/digital convertors (A/D convertors, ADC) 6, 7. DSP 4 has a function as an effect adding means, and performs an effect adding process in accordance with a program sent from CPU 1. The A/D convertor 6 converts an L-channel signal and R-channel signal of the musical-tone signal into a digital musical-tone signal and supplies it to an input terminal IN 1 of CPU 1 while A/D convertor 7 converts an E-channel signal and T-channel signal into a digital musical-tone signal and inputs it to an input terminal IN 2.

The digital musical-tone signal which is applied with a plurality of sound effects is converted into analog musical-tone signals by digital/analog convertors (D/A convertors, DAC) 8, 9, and then the analog musical-tone signals are audibly output from speakers (not shown) through amplifiers (not shown).

The D/A convertor 8 converts the digital musical-tone signal, particularly an L-channel signal and R-channel signal, output from an output terminal OUT 1 of DSP 4 into analog musical-tone signals while the D/A convertor 9 converts the digital musical-tone signal, particularly 1-channel signal and 2-channel signal, output from an output terminal OUT 2 of DSP 4 into analog musical-tone signals.

Figure 2:
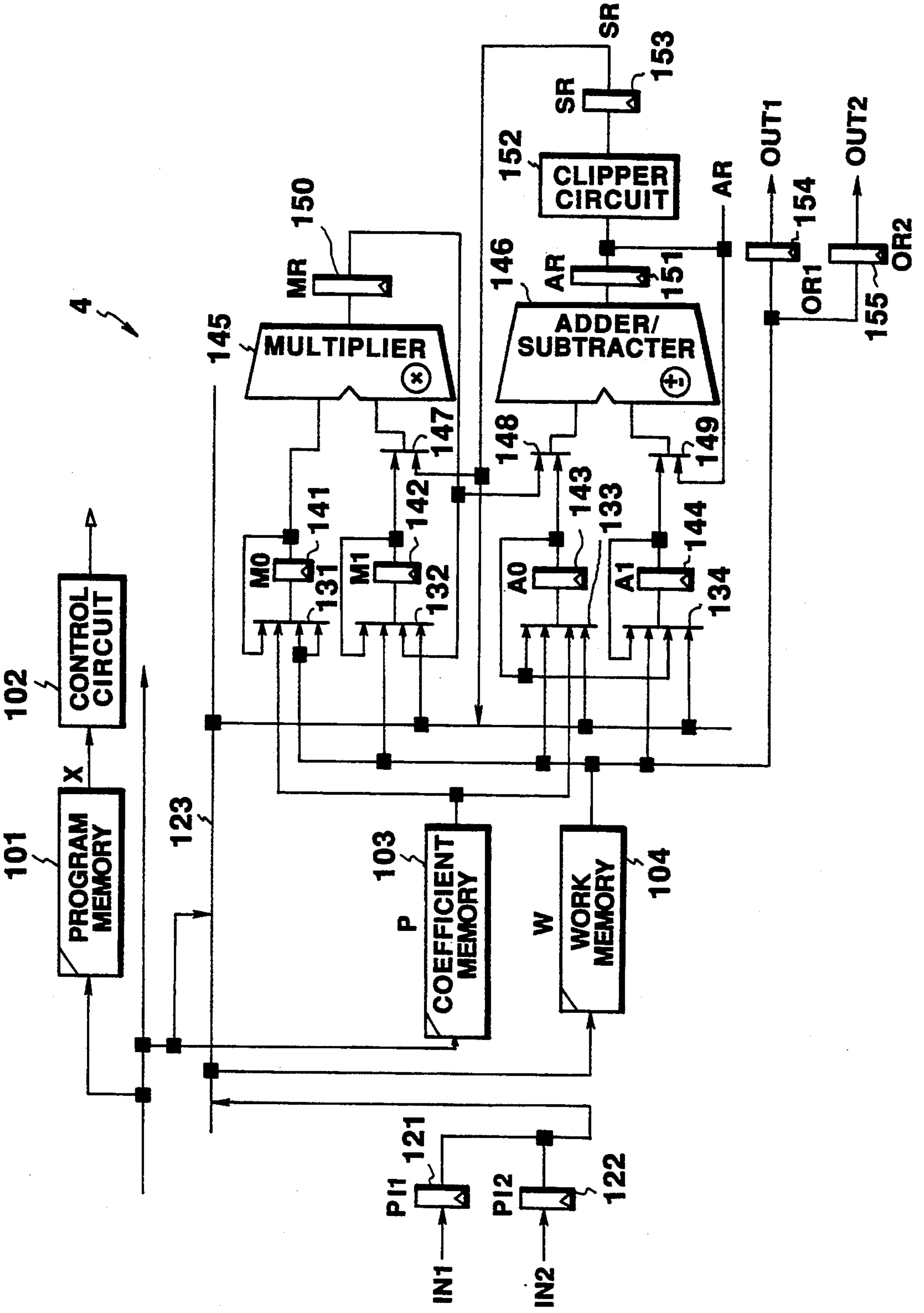
FIG. 2 is a circuit diagram of digital signal processor (DSP) in the first embodiment.

FIG. 2 is a view showing an internal structure of DSP 4.

In FIG. 2, a program memory 101 is a memory which stores predetermined micro-programs, and outputs a predetermined operation-program to a control circuit 102 in accordance with a program transferred from CPU 1 of FIG. 1. At this time, an address counter (not shown) is connected to the program memory. The program memory 101 successively supplies the control circuit 102 with contents of the program in accordance with address instructions sent from the address counter.

The control circuit 102 outputs various signals for controlling operations and data transfer between registers and memories as will be described later, and signals for open/close control of gates and latch circuits, and further outputs a counter value SC which is incremented every sampling time, performing predetermined signal processing operations.

A coefficient memory (P) 103 is a memory which stores various coefficients as will be described later with reference to FIG. 16. These coefficients are read out from RAM 3 of FIG. 1 and are stored in the coefficient memory (P) 103 under control of CPU 1.

A work memory (W) 104 is a memory for temporarily storing waveform signals and the like generated in DSP 4, as will be described later referring to FIG. 15.

An input register (PI1) 121 stores the digital musical-tone signal (L-channel signal and R-channel signal) input to DSP 4 from A/D convertor 6 of FIG. 1 through the input terminal IN1, and supplies the digital musical-tone signal to various sections via an internal bus 123.

In a similar manner, an input register (PI2) 122 stores the digital musical-tone signal (E-channel signal and T-channel signal) input to DSP 4 from A/D convertor 7 of FIG. 1 through the input terminal IN2, and supplies the digital musical-tone signal to various sections via an internal bus 123.

The output signals of the above coefficient memory (P) 103, the work memory (W) 104 and the output signals of the input registers (PI1) 121 and (PI2) 122 are input to gate terminals of gates 131 through 134 together with output signals from respective registers to be described later. The output signals of the gates 131 through 134 are input to registers (M0) 141, (M1) 142, (A0) 143 and (A1) 144.

The registers (M0) 141 and (M1) 142 store data under an operation which is to be supplied to a multiplier 145 while the registers (A0) 143 and (A1) 144 stores data under an operation which is to be supplied to adder/-subtracter 146.

The output signal of the register (M1) 142 and an output signal of a register (SR) 153 to be described later are input to the multiplier 145 through the gate 147 while the output signal of the register (A0) 143 and an output signal of a register (MR) 150 to be described later are input to the adder/subtracter 146 through the gate 148. Further, the output signal of the register (A1) 144 and an output signal of a register (AR) 151 to be described later) are input to the adder/subtracter 146 through the gate 149.

The adder/subtracter 146 performs an addition and a subtraction and performs a process (a so-called through process) which allows data to pass through under an instruction from the control circuit 102.

A result of operation performed by the multiplier 145 is stored in the register (MR) 150 and the output of the register (MR) 150 is supplied to the gates 132 and 148. A result of operation performed by the adder/subtracter 146 is stored in the register (AR) 151, and the output of the register (AR) 151 is supplied to the gate 149 and to the register (SR) 153 through clipper circuit 152.

The clipper circuit 152 serves to prevent an over flow. The output of the register (SR) 153 is supplied to gate 147 and is transferred and stored as a result of an operation or a process performed on one tone in the work memory 104 through the internal bus 123.

Figure 9:
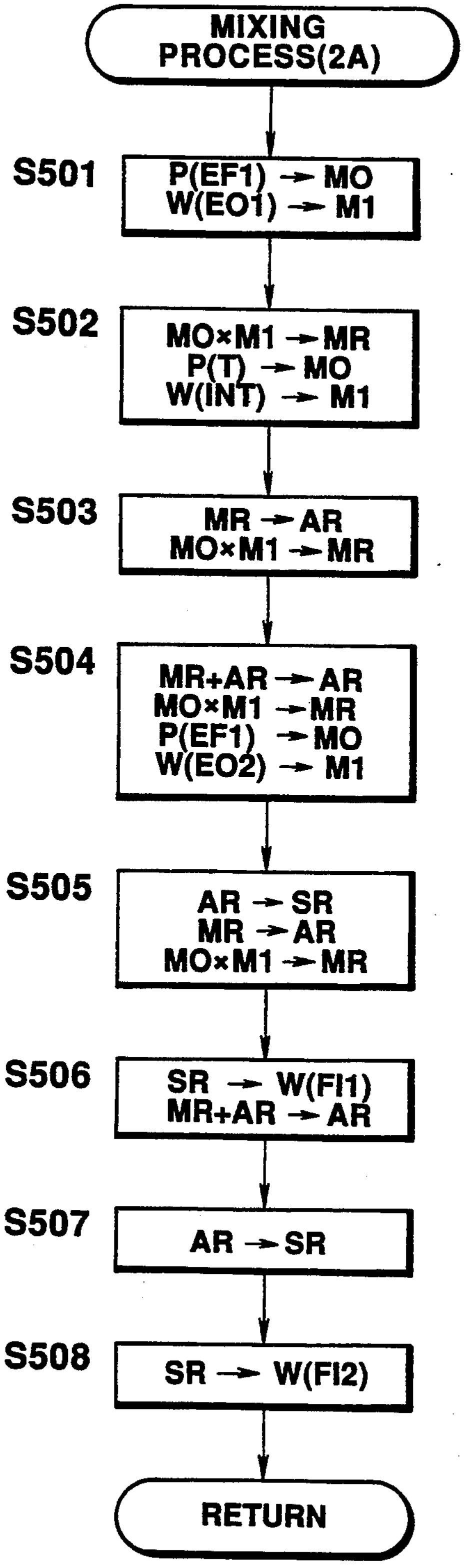
FIG. 9 is a flow chart showing a detailed operation of a mixing process (2A) in the first embodiment.

When the results of the above operations are stored in the work memory (W) 104 and a series of processes are completed, data stored in the work memory (W) 104 are transferred to output registers (OR1) 154 and (OR2) 155, and further are transferred therefrom to D/A convertors 8 and 9 of FIG. 9.

The output register (OR1) 154 stores the L-channel signal and the R-channel signal, and outputs the same signals to D/A convertor 8 through the output terminals OUT 1 of DSP 4 while the output register (OR2) 155 stores the 1-channel signal and the 2-channel signal, and outputs the same signals to D/A convertor 9 through the output terminals OUT 2 of DSP 4.

Now, the principle of a multi-effect adding operation according to the present invention will be described with reference to the present embodiment.

Figure 3:
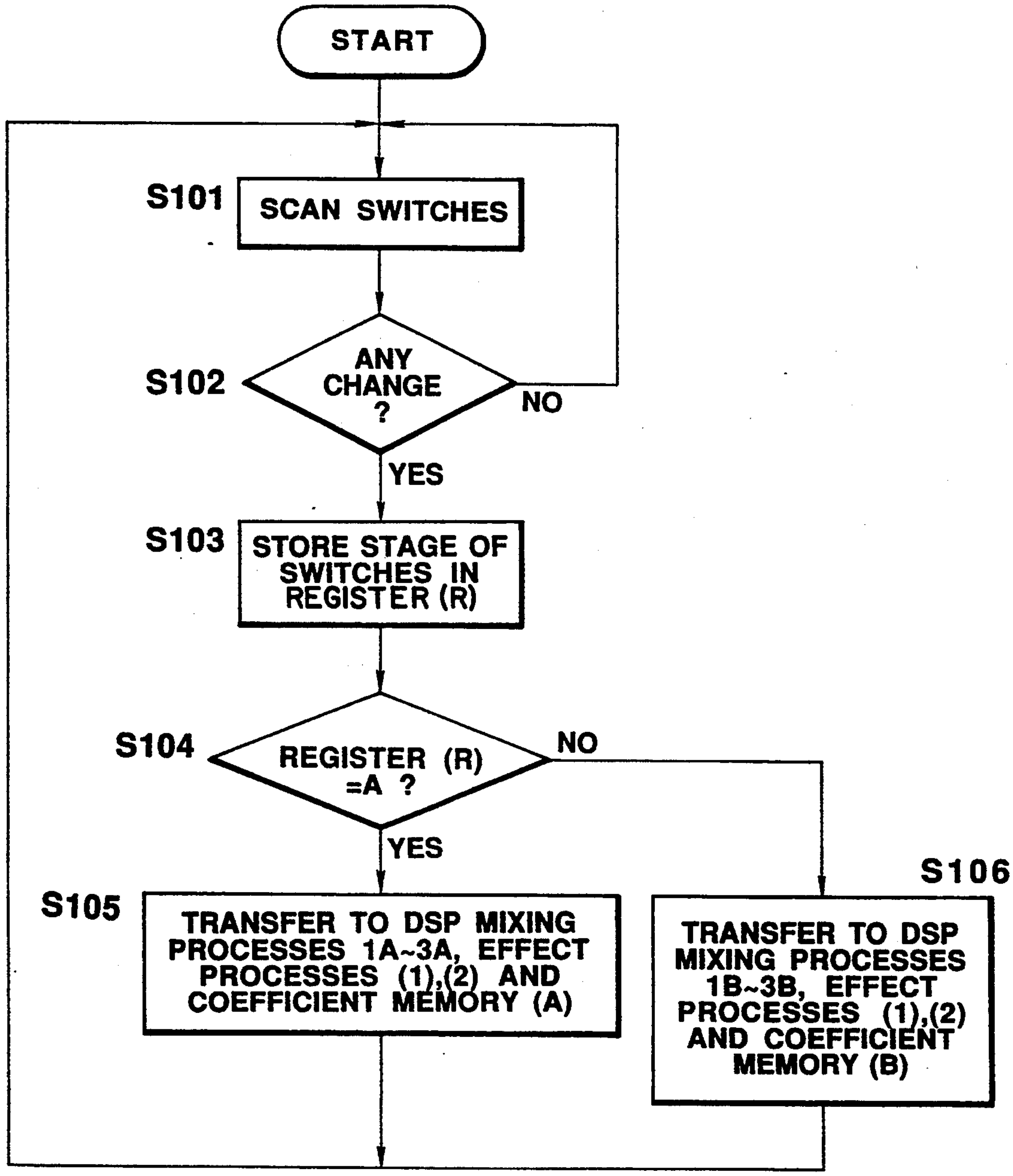
FIG. 3 is a flow chart of operation of a central processing unit (CPU) in the first embodiment.

FIG. 3 is a flow chart of a program routine of the multi-effect adding operation which is performed by CPU 1.

In FIG. 3, CPU 1 scans or refers to the switch section 5 at step S101, obtaining external data for judging whether or not a player (for example, a player of an electronic musical instrument) has operated the switch section 5 to apply or add the multi-effects to a musical-tone signal. At step S102, CPU 1 judges if any change has occurred is occurs in the switch section 5, i.e., whether or not the player has operated the switch section 5 to apply or add the multi-effects to the signal. When it is judged that some changes have been found in the state of switch section 5, or when the result of the judgement at step S102 is YES, CPU 1 stores the state of the switch section 5 in its register (R) (not shown). 0n the contrary, when no change has been found in the state of the switch section 5, i.e., when the player has not operated the switch section 5, CPU 1 returns to step S101, waiting for a change.

CPU 1 judges at step S104 from the state of the switch section 5 stored in the register (R) whether or not the content of the register (R) is equivalent to a value A corresponding to an effect adding process (A). The effect adding process (A) is one example of combinations of a plurality of effect processes (1) and (2) (two effect processes in the present invention) which are to be applied in a different form to a plurality of channels of signals.

When the result of the judgement at step S104 is YES, CPU 1 judges at step S105 from the state of the switch section 5 that the effect adding process (A) is requested to be performed, transferring to DSP 4 programs for mixing processes (1A) to (3A) and effect processes (1) and (2), and also transferring contents of the coefficient memory (A) to DSP 4.

Then, DSP 4 executes a process for performing on a plurality of channels of signals one combination of effect adding process (A) among a plurality of combinations of effect adding processes.

When CPU 1 judges at step S104 from the state of the switch section 5 stored in the register (R) that the content of the register (R) is not equivalent to a value A corresponding to an effect adding process (A), i.e., when the result of the judgement at step S104 is NO, CPU 1 judges that an effect adding process other than the effect adding process (A) is requested to be performed, transferring at step S106 programs for the mixing processes (1B) to (3B) and effect processes (1) and (2) to DSP 4, and also transferring to DSP 4 contents of the coefficient memory (B) as coefficients which are necessary for performing an operation process.

Then, DSP 4 executes a process for performing one combination of effect adding process among a plurality of combinations of effect adding processes.

Algorithms (effect-algorithms) for performing the effect processes (1) and (2) have long descriptions and are previously stored in ROM 2 which CPU 1 can control. The mixing processes (1A) to (3A) and the mixing processes (1B) to (3B) are algorithms (combination-algorithm) for determining how the algorithms of the effect processes (1) and (2) should be combined with respect to a plurality of channels of signals, and are stored in ROM 2 similarly to the effect-algorithms but have a relatively short description.

When a process of step S105 is performed, CPU 1 writes a program on the basis of the effect-algorithms for performing the effect processes (1) and (2), and combination-algorithms or mixing processes (1A) to (3A) for determining how the effect-algorithms should be combined with respect to a plurality of channels of signals, and then CPU 1 transfers the program to DSP 4.

As described above, the algorithms (effect-algorithms) for respective effect processes and algorithms (combination-algorithms) for combining in various forms these effect processes are previously stored in the present embodiment. When a selecting operation is externally executed to apply to a signal one of combinations of a plurality of effects, CPU 1 selects relevant algorithms for performing effect processes and also an algorithm for combining in various forms these algorithms in accordance with the selecting operation, and then CPU 1 writes one program using these algorithms and sends the program to DSP 4. DSP 4 perform a process for applying to the signal effects according to one of combinations of effects.

In the present embodiment, there is no need to previously store as programs in ROM 2 all the combinations of effects in different forms, to prepare required number of algorithms for changing the combination of effect processes and to change a program to be transferred to DSP 4, which increases a capacity of memory, but what are to be previously stored are effect-algorithms for performing effect processes and combination-algorithms for combining these effect-algorithms, which requires only a relatively small capacity of memory.

Further, the present embodiment is arranged such that, when a selecting manipulation is externally executed, an effect-algorithm for executing effect processes and a combination-algorithm for combining these effect-algorithms in different form are selected to prepare a program to be transferred to DSP 4.

In the present embodiment, therefore, there is no need to previously store as programs all the combinations of effects, so that a capacity of the memory can be remarkably reduced. In particular, since the effect-algorithms for performing effect processes have long descriptions, it is the main reason for the reduced capacity of memory that all these effect-algorithms are not necessary to be stored for respective combinations of effect-algorithms.

Even if a plurality of effects are applied to an audio signal, the player is not required to perform troublesome operations during his performance for changing a wiring connection of a plurality of hardware effectors because the present embodiment has no plurality of hardware effectors connected to one another. The player is allowed to enjoy features of multi-effectors that apply multiple effects to sounds with a simple switching operation.

The present embodiment of the invention has no such drawback that makes complex the wiring connection of the effectors because the player is not required during his performance to switch the wiring connection of the effectors with switching means.

As described above, the effect adding apparatus of the present invention is capable of changing a combination of sound effects to be applied to the input audio signal without need of a large capacity of memory and without switching the wiring connection of the effectors.

Figure 4:
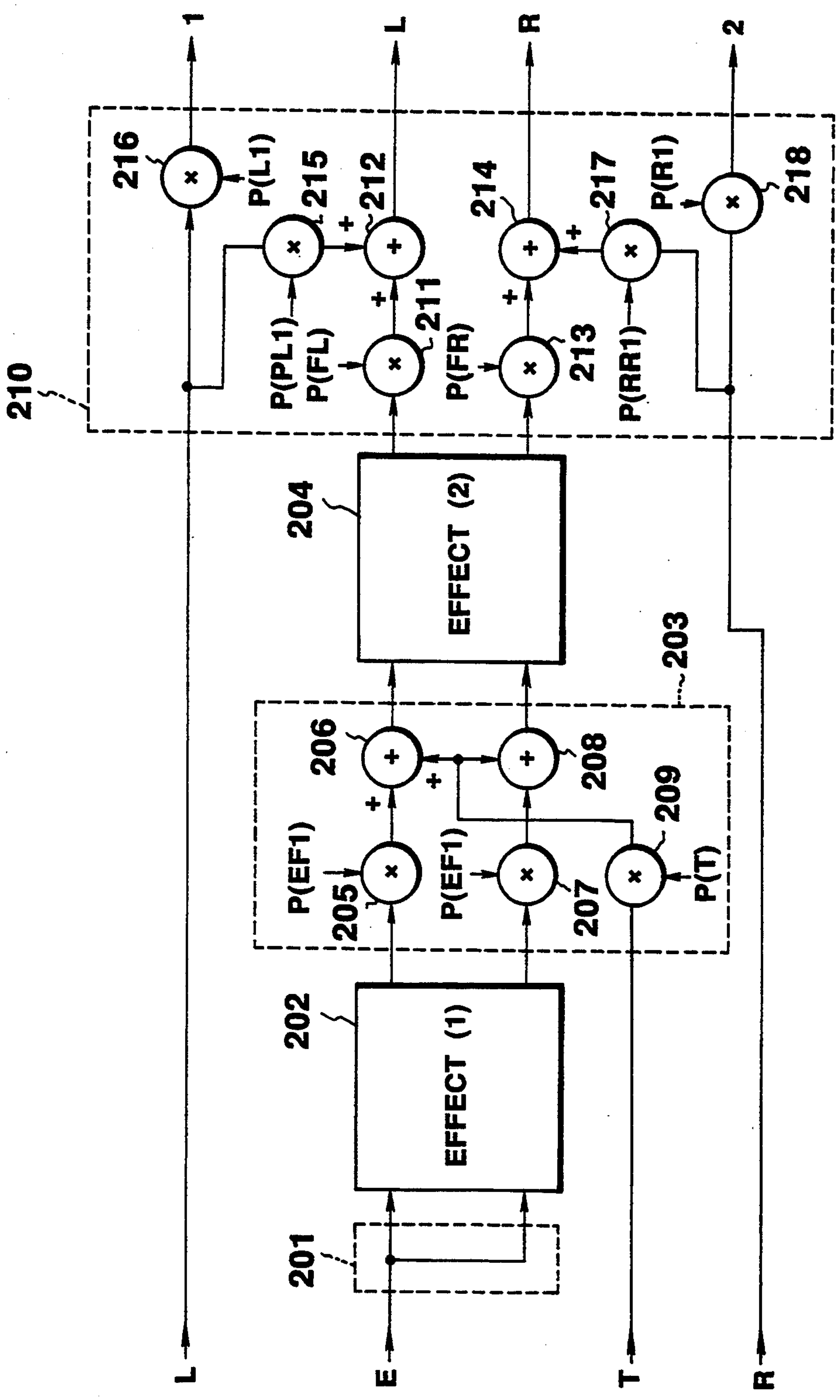
FIG. 4 is a circuit diagram showing a hard circuit in the first embodiment for executing one form of multi-effect adding processes.
Figure 5:
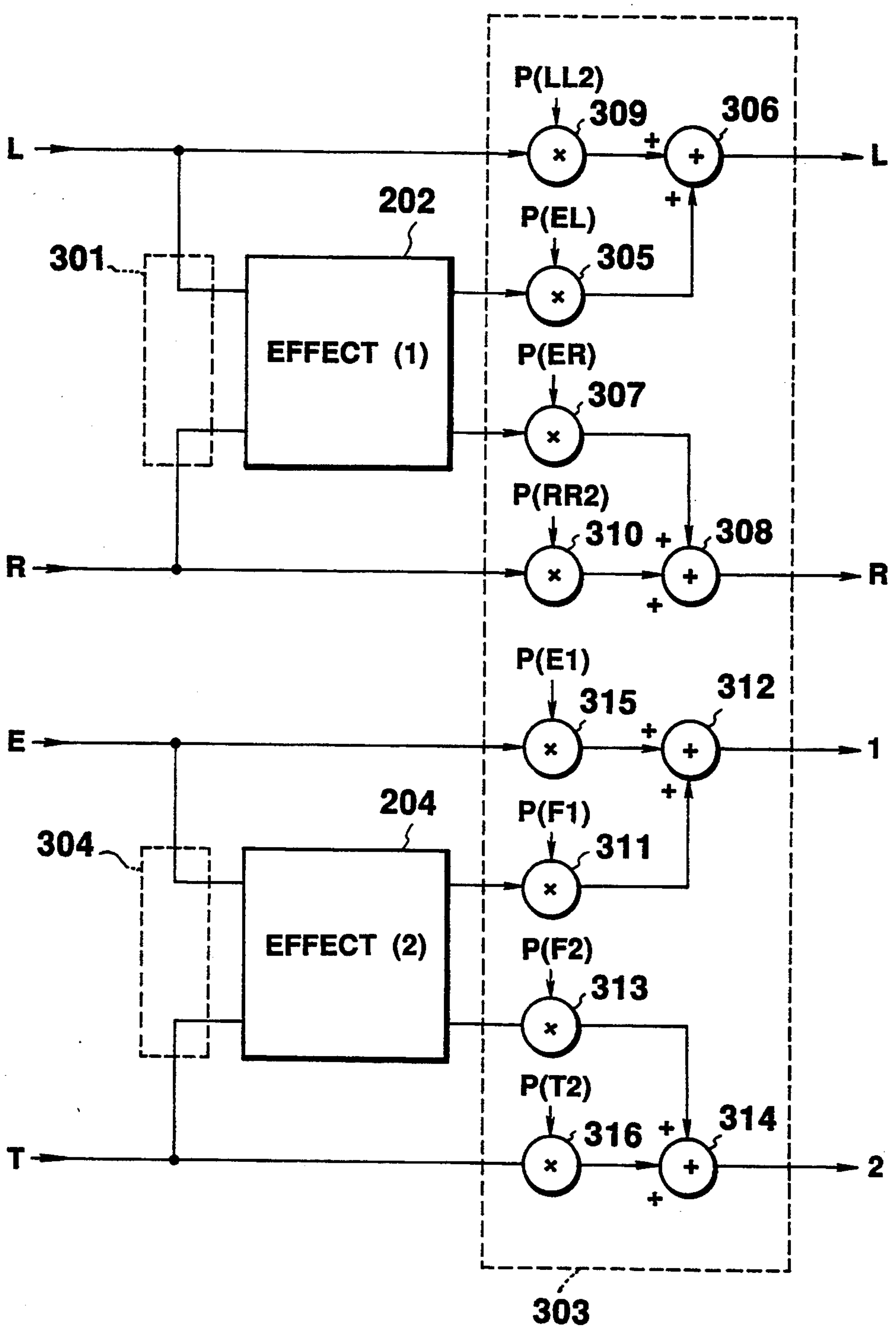
FIG. 5 is a circuit diagram showing a hard circuit in the first embodiment for executing another multi-effect adding process.

FIGS. 4 and 5 are views schematically illustrating a hardware circuit performing one form of multi-effect adding processes in DSP 4. Contents of the coefficient memory (P) 103 and the work memory (W) 104 of DSP 4 of FIGS. 4 and 5 are shown in FIGS. 15 and 16, respectively.

FIG. 4 is a view showing a first form of the effect adding process (A) for applying multi-effects to four input audio signals such as an L-channel signal, E-channel signal, T-channel signal and R-channel signal.

In FIG. 4, the E-channel signal is subjected to a mixing (MIX) process (1A) 201, being separated into two systems of signals to be input to an effect (1) process 202. The effect (1) process 202 adds or applies a sound effect such as, for example, the reverberation effect to the input signals. The effect (1) process 202 applies the reverberation effect to the E-channel signals which are input thereto through the mixing process (1A) 201, and outputs the same to a mixing process (2A) 203.

The contents of the effect (1) process 202 for applying the reverberation effect is well known and therefore its detailed hardware circuit will be omitted.

In the mixing process (2A) 203, the two systems of E-channel signals with the reverberation effect applied are mixed with the T-channel signal at a predetermined rate, and then the two systems of E-channel signals are output to an effect (2) process 204. More specifically, one of two systems of E-channel signals with the reverberation effect applied is led to a multiplier 205, where the signal is multiplied by an effector (1) output multiplying coefficient P (EF1) shown in FIG. 16*a*, and then is sent to an adder 206.

Meanwhile, the other one of two systems of E-channel signals with the reverberation effect applied is led to a multiplier 207, where the signal is multiplied by an effector (1) output multiplying coefficient P (EF1) shown in FIG. 16*a*, and then is sent to an adder 208.

The T-channel signal is led to a multiplier 209, being multiplied by T-channel multiplying coefficient P (T), and then is transferred to the adders 206 and 208. One of two systems of E-channel signal with the reverberation effect applied, that is, a signal which is multiplied by the effector (1) output multiplying coefficient P (EF1) in the multiplier 205, and the T-channel signal which is multiplied by the T-channel multiplying coefficient P (T) in the multiplier 209 are added in the adder 206 and the added signal is output to the effect (2) process 204.

The other one of two systems of E-channel signal with the reverberation effect applied, that is, a signal which is multiplied by the effector (1) output multiplying coefficient P (EF1) in the multiplier 207, and the T-channel signal which is multiplied by the T-channel multiplying coefficient P (T)in the multiplier 209 are added in the adder 206 and the added signal is output to the effect (2) process 204.

As described above, two systems of E-channel signals and the T-channel signal are mixed to each other at a predetermined rate.

The effect (2) process 204 is for applying a sound effect such as the chorus effect to input audio signals. In the effect (2) process 204, two systems of channel signals which have been processed in the mixing process (2A) 203 are applied with the chorus effect and then are transferred to a mixing process (3A) 201.

The contents of the effect (2) process 204 for applying the chorus effect are well known and therefore its detailed hardware circuit will be omitted.

In the mixing process (3A) 210, two systems of channel signals with the chorus effect applied are mixed with the L-channel signal and the R-channel signal at predetermined rates respectively, and are divided into four signals, i.e., 1-channel signal, L-channel signal, R-channel signal and 2-channel signal, which are output from DSP 4.

More specifically, one of two systems of signals output from the effect (2) process 204, that is, signals which have been applied with the chorus effect, is led to a multiplier 211, where it is multiplied by an effector (2) output multiplying coefficient P (FL), and further is sent to an adder 214.

Meanwhile, the L-channel signal is led to a multiplier 215, being multiplied by an L-channel multiplying coefficient P (PL1), and then is sent to an adder 212. At the same time, the L-channel signal is also led to a multiplier 216, being multiplied by an L-channel multiplying coefficient P (L1), and then is output as 1-channel signal from DSP 4.

In the adder 212, outputs of the multipliers 211 and 215 are added together. More specifically, one of two systems of output signals of the effect (2) process which has been applied with the chorus effect and has been adjusted in the multiplier 211 to a level determined by the effector (2) output multiplying coefficient P (FL), and the L-channel signal which has been adjusted in the multiplier 215 to a level defined by the L-channel multiplying coefficient P (PL1) are added together to be output from DSP 4.

In a similar manner, the R-channel signal is led to a multiplier 217, being multiplied by an R-channel multiplying coefficient P (RR1), and then is sent to an adder 214. At the same time, the R-channel signal is also led to a multiplier 218, being multiplied by an R-channel multiplying coefficient P (R1), and then is output as 2-channel signal from DSP 4.

In the adder 214, outputs of the multipliers 213 and 217 are added together. More specifically, the other one of two systems of output signals of the effect (2) process which has been applied with the chorus effect and has been adjusted in the multiplier 213 to a level determined by the effector (2) output multiplying coefficient P (FR), and the R-channel signal which has been adjusted in the multiplier 217 to a level that is defined by the R-channel multiplying coefficient P (RR1) are added together to be output from DSP 4.

During the above process, the E-channel signal is applied with the reverberation effect and then is mixed with the T-channel signal. The resultant signal is further applied with the chorus effect, then mixed with the L-channel signal and R-channel signal, and finally is divided into four systems of signals, i.e., L-channel signal, R-channel signal, 1-channel signal and 2-channel signal.

FIG. 5 is a view showing a second form of the effect adding process (B), which is different from the effect adding process (A), for applying multi-effects to four input audio signals such as an L-channel signal, E-channel signal, T-channel signal and R-channel signal.

In FIG. 5, the L-channel signal and R-channel signal are subjected to a mixing (MIX) process (1B) 301, being input to an effect (2) process 202 which is similar to that of FIG. 4. The effect (1) process 202 adds or applies the reverberation effect to the L-channel signal and the R-channel signal which have been transferred thereto through the mixing process (1B) 301, and outputs these signals to a mixing process (3B) 303.

Meanwhile, the E-channel signal and T-channel signal are subjected to a mixing (MIX) process (2B) 304, being input to an effect (2) process 204 which is similar to that of FIG. 4. The effect (2) process 204 adds or applies the chorus effect to the E-channel signal and the T-channel signal which have been transferred thereto through the mixing process (2B) 304, and outputs these signals to a mixing process (3B) 303.

In the mixing process (3B) 303, the L-channel signal with the reverberation effect applied is mixed with the L-channel signal with no reverberation effect applied at a predetermined rate while the R-channel signal with the reverberation effect applied is mixed with the R-channel signal with no reverberation effect applied at a predetermined rate. Then, these two systems of signals are output from DSP 4 again as the L-channel signal and R-channel signal respectively.

Meanwhile, the E-channel signal with the chorus effect applied is mixed with the original E-channel signal with no chorus effect applied at a predetermined rate while the T-channel signal with the chorus effect applied is mixed with the original T-channel signal with no chorus effect applied at a predetermined rate. Then, these two systems of signals are output from DSP 4 again as the E-channel signal and T-channel signal respectively.

More specifically, the L-channel signal with the reverberation effect applied is led to a multiplier 305, where it is multiplied by an effector (1) output multiplying coefficient P (EL), and further is sent to an adder 306 while the R-channel signal with the reverberation effect applied is led to a multiplier 307, where it is multiplied by the effector (1) output multiplying coefficient P (ER), and then is sent to an adder 308.

Meanwhile, the L-channel signal is directly led to a multiplier 309, being multiplied by an L-channel multiplying coefficient P (LL2), and then is output to adder 306. In the adder 306, the L-channel signal which has been applied with the reverberation effect and has been adjusted to a predetermined level that is defined by the multiplier 305 in accordance with the effector (1) output multiplying coefficient P (EL) is added to the L-channel signal which has been adjusted to a level that is defined by the multiplier 309 in accordance with the L-channel multiplying coefficient P (LL2), and then the resultant signal is output as the L-channel signal from DSP 4 again.

The R-channel signal is directly led to a multiplier 310, being multiplied by an R-channel multiplying coefficient P (RR2), and then is output to an adder 308. In the adder 308, the R-channel signal which has been applied with the reverberation effect and has been adjusted to a predetermined level that is defined in the multiplier 307 by the effector (1) output multiplying coefficient P (ER) is added to the R-channel signal which has been adjusted to a level that is defined in the multiplier 310 by the R-channel multiplying coefficient P (RR2), and then the resultant signal is output as the R-channel signal from DSP 4 again.

Therefore, the L-channel signal and R-channel signal both with the reverberation effect applied are mixed with the original L-channel signal and R-channel signal both with no reverberation effect applied at a predetermined rate, respectively, and then are output from DSP 4 again as the L-channel signal and R-channel signal.

In a similar manner, the E-channel signal with the chorus effect applied is led to a multiplier 311, where it is multiplied by an effector (2) output multiplying coefficient P (F1), and further is sent to an adder 312 while the T-channel signal with the chorus effect applied is led to a multiplier 313, where it is multiplied by the effector (2) output multiplying coefficient P (F2), and then is sent to an adder 314.

Meanwhile, the E-channel signal is directly led to a multiplier 315, being multiplied by an E-channel multiplying coefficient P (El), and then is transferred to adder 312. In the adder 312, the E-channel signal which has been applied with the reverberation effect and has been adjusted to a predetermined level that is defined by the multiplier 311 in accordance with the effector (2) output multiplying coefficient P (F1) is added to the E-channel signal which has been adjusted to a level that is defined by the multiplier 315 in accordance with the E-channel multiplying coefficient P (El), and then the resultant signal is output as the 1-channel signal from DSP 4 again.

The T-channel signal is directly led to a multiplier 316, being multiplied by a T-channel multiplying coefficient P (T2), and then is sent to an adder 314. In the adder 314, the T-channel signal which has been applied with the reverberation effect and has been adjusted to a predetermined level that is defined by the multiplier 313 in accordance with the effector (2) output multiplying coefficient P (F2) is added to the T-channel signal which has been adjusted to a level that is defined by the multiplier 316 by the T-channel multiplying coefficient P (T2), and then the resultant signal is output as the 2-channel signal from DSP 4 again.

Therefore, the E-channel signal and T-channel signal both with the chorus effect applied are mixed with the original E-channel signal and T-channel signal both with no reverberation effect applied at a predetermined rate, respectively, and then are output from DSP 4 again as the E-channel signal and T-channel signal, respectively.

During the above process, the L-channel signal and R-channel signal are applied with the reverberation effect, and then are mixed with the original L-channel signal and R-channel signal both with no reverberation effect applied, respectively. The resultant signals are output as the L-channel signal and R-channel signal, respectively. Meanwhile, the E-channel signal and T-channel signal are applied with the chorus effect, and then are mixed with the original E-channel signal and T-channel signal both with no chorus effect applied, respectively. The resultant signals are output as the 1-channel signal and 2-channel signal, respectively. Finally, four channels of signals i.e., the L-channel signal, R-channel signal, 1-channel signal and 2-channel signal are output from DSP 4.

Now, actual operation of DSP 4 structured as shown in FIGS. 4 and 5 will be described in detail with reference to the operation flow charts of FIGS. 6 to 14.

CPU 1 selects effect-algorithms for effect processes and a combination-algorithm for combining the effect algorithms in the form as shown in FIGS. 4 and 5, and writes a program, which is transferred to DSP 4. Then, DSP 4 stores the program transferred from CPU 1 in a program memory 101, and successively reads out the stored program as micro-programs to execute them as various processes.

In FIGS. 15 and 16 are shown addresses in the coefficient memory (P) 103 where coefficients (constants) or variables are stored .and addresses of the work memory 104 where data are temporarily stored. Names and contents of these coefficients, variables and data are also shown in FIGS. 15 and 16.

Figure 6:
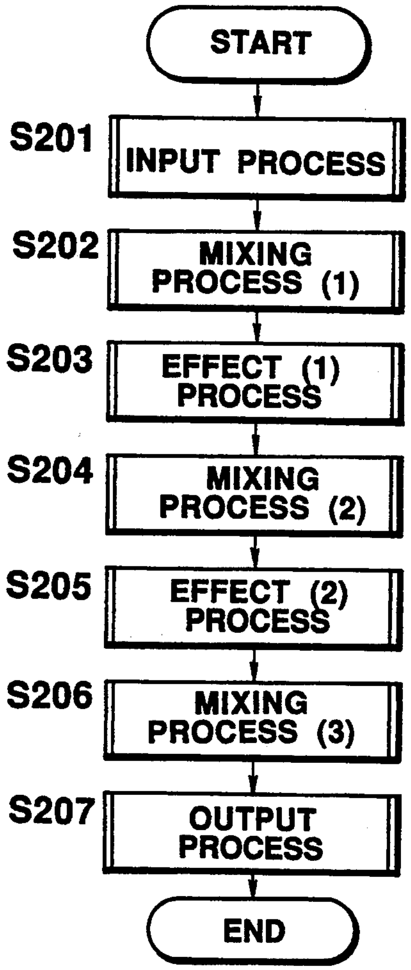
FIG. 6 is a flow chart showing a general operation for executing a multi-effect adding process in the first embodiment.

FIG. 6 is a main flow chart of the multi-effects, the flow chart of which is illustrated in a flow for realizing various forms to explain the above effect-adding process (A) and effect adding process (B) to be executed.

In FIG. 6, an input process is executed at step S201, through which musical tone signals are input into DSP 4, that is, four musical tone signals are separately input to channels respectively.

At step S202, a mixing process (1) is executed. The mixing process (1) represents how these four channels of signals are mixed and applied with sound effects. The mixing process (1A) 201 or the mixing process (1B) 301 is executed in the mixing process (1).

At the following step S203, an effect process (1) is executed. In the effect process (1),the reverberation effect is applied to the signals based on how these four channels of signals are mixed.

At step S204, a mixing process (2) is executed. The mixing process (2) represents how these four channels of signals are mixed and applied with sound effects. The mixing process (2A) 203 or the mixing process (2B) 304 is executed in the mixing process (2).

At the following step S205, an effect process (2) is executed. In the effect process (2), the reverberation effect is applied to the signals based on how these four channels of signals are mixed.

A mixing process (3) is executed at step S206. More specifically, the mixing process (3A) 210 or the mixing process (3B) 303 is executed in the mixing process (3).

An output process is executed at step S207 to output from DSP 4 musical tone signals which have been subjected to the multi-effect process. Through the output process, four musical tone signals which have been subjected to the multi-effect process are separately output from DSP 4 to channels respectively.

Details of the above processes are shown in FIG. 7 through 14, and detailed contents of these processes will be described.

Figure 7:
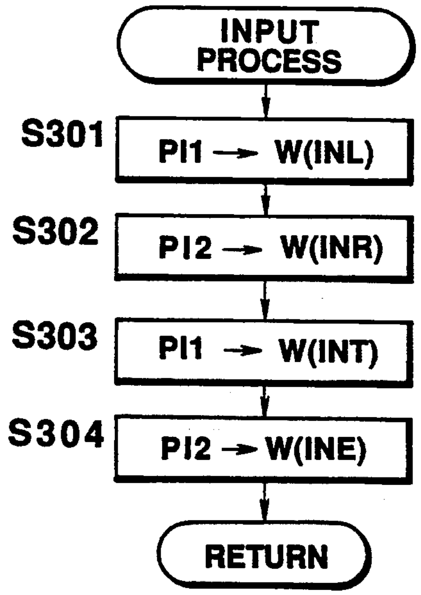
FIG. 7 is a flow chart showing a detailed operation of an input process in the first embodiment.

FIG. 7 is a view showing details of the input process (step S201).

At step S301 of FIG. 7, a musical tone signal retrieved in the input register (PI1) 121 is stored in the work memory(W) 104 as L-channel input data W (INL). At step S302, a musical tone signal retrieved in the input register (PI2) 122 is stored in the work memory(W) 104 as R-channel input data W (INR).

In a similar manner, at step S303, a musical tone signal retrieved in the input register (PI1) 121 is stored in the work memory(W) 104 as T-channel input data W (INT). At step S304, a musical tone signal retrieved in the input register (PI2) 122 is stored in the work memory(W) 104 as E-channel input data W (INE). In this manner, respective channels of input data are stored in the work memory (W) 104 at relevant addresses.

Figure 8:
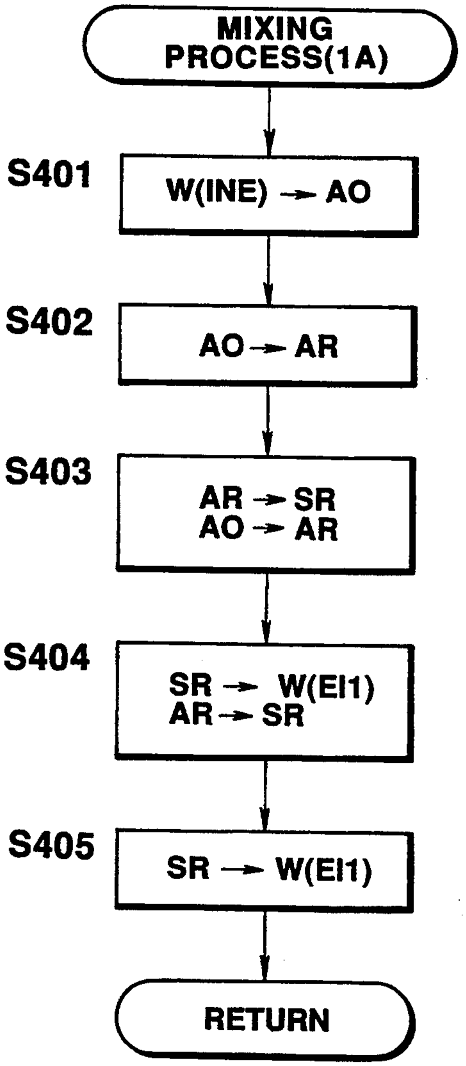
FIG. 8 is a flow chart showing a detailed operation of a mixing process (1A) in the first embodiment.
Figure 10:
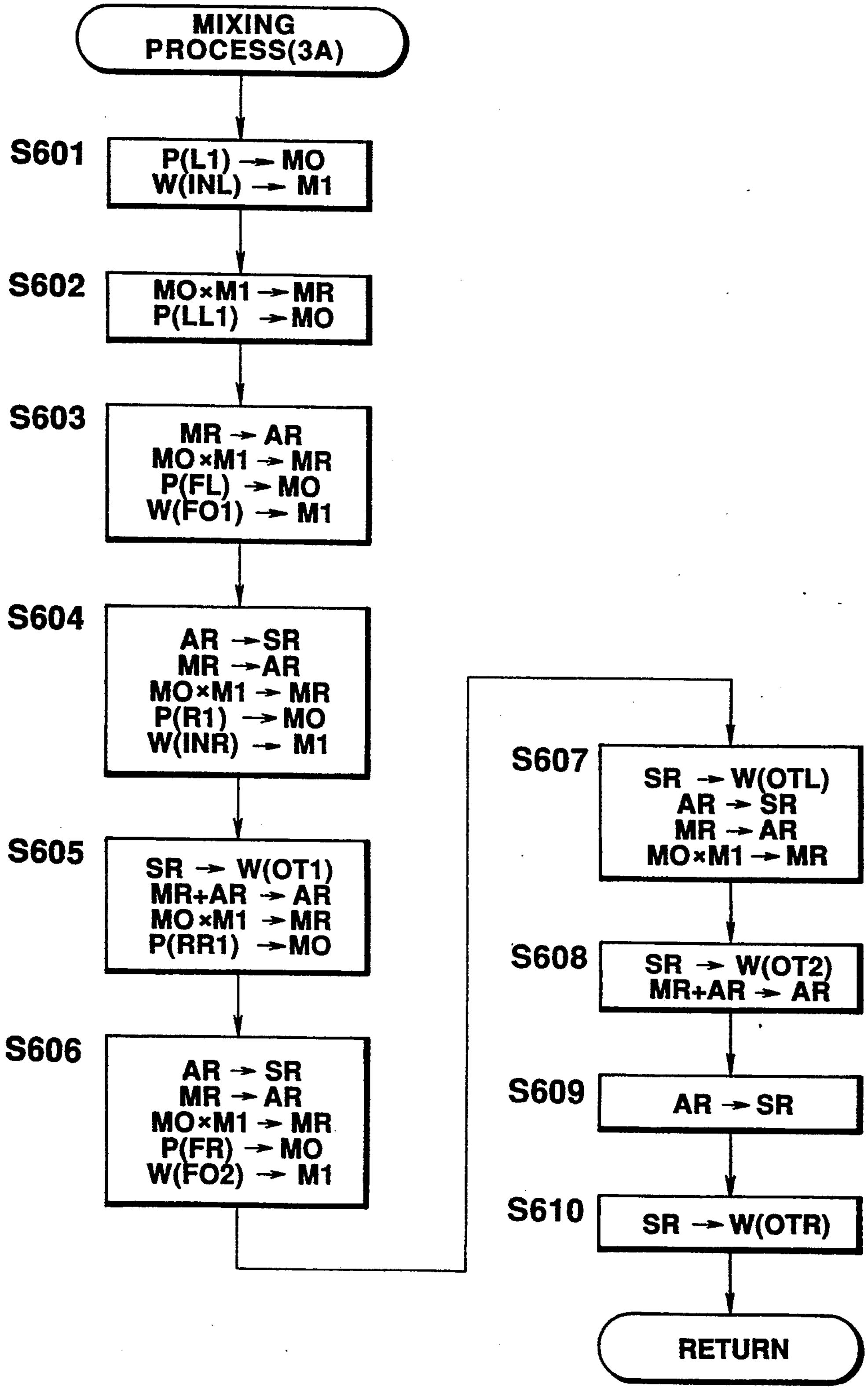
FIG. 10 is a flow chart showing a detailed operation of a mixing process (3A) in the first embodiment.

FIGS. 8 to 10 are views showing details of the mixing processes (1A), (2A) and (3A). FIG. 8 is a view showing the mixing process (1A).

In FIG. 8, E-channel input data W (INE) is read out from the work memory (W) 104 and is stored in a register (A0) 143 at step S401. At step S402, the input data W (INE) stored in the register (A0) 143 is transferred to the register (AR) 151 through the gate 148 and the adder/subtractor 146.

At step S403, the input data W (INE) transferred to the register (AR) 151 is stored in the register (SR) 153 through the clipper circuit 152, and further the input data W (INE) stored in the register (A0) 143 is transferred to the register (AR) 151 again through the gate 148 and the adder/subtractor 146.

At the following step S404, the other input data W (INE) transferred to the register (AR) 151 is stored in the register (SR) 153 through the clipper circuit 152 while the former data SR (that is, the former input data W (INE)) previously stored in the register (SR) 153 is stored as effector (1) input channel data W (EI1) in the work memory (W) 104 at the relevant address through internal bus 123.

The latter input data W (INE) transferred to the register (AR) 151 is stored in the register (SR) 153 through the clipper circuit 152 at the same step S404. Then, at step S405, the latter data SR (that is, the latter input data W (INE)) previously stored in the register (SR) 153 is stored as effector (1) input channel data W (EI1) in the work memory (W) 104 at the relevant address through the internal bus 123.

As described above, a function similar to the mixing process (1A) 201 of FIG. 4 is performed.

FIG. 9 is a view showing the mixing process (2A) in detail.

In FIG. 9, the effector (1) output multiplying coefficient P (EF1) is read out from the coefficient memory (P) 103 and is stored in the register (M0) 141, and the effector (1) output channel data W (EO1) is read out from the work memory (W) 104 and is stored in the register (M1) 142 at step S501.

At step S502, the effector (1) output multiplying coefficient P (EF1) set in the register (M0) 141 is supplied to the multiplier 145, and the effector (1) output channel data W (EO1) set in the register (M1) 142 is supplied through the gate 147 to the multiplier 145. At the multiplier 145, the data W (EO1) is multiplied by the coefficient P (EF1), and the product is stored in the register (MR) 150. In this way, a process having a function equivalent to the function of the multiplier 205 of FIG. 4 will be realized through the above processes.

At the same step S502, the T-channel multiplying coefficient P (T) is read out from the coefficient memory (P) 103 and is stored in the register (M0) 141, and the T-channel input data W (INT) is read out from the work memory (W) 104 and is stored in the register (M1) 142.

At step S503, the product obtained by the multiplier 145, which has been stored in the register (MR) 150, is transferred to the register (AR) 151 through the gate 148 and the adder/subtractor 146, and the T-channel multiplying coefficient P (T) set in the register (M0) 141 at step S502 is supplied to the multiplier 145, and further, the T-channel input data W (INT) set in the register (M1) 142 is supplied through the gate 147 to the multiplier 145. At the multiplier 145, the data W (INT) is multiplied by the coefficient P (T), and the product is stored in the register (MR) 150. Through the above processes, a process having a function equivalent to the function of the multiplier 209 of FIG. 4 is realized.

At step S504, the product obtained by the multiplier 145, which has been stored in the register (AR) 151, is transferred to one of the input terminals of the adder/-subtractor 146 through the gate 149, and the result of the calculation at step S503 (that is, the product of the T-channel multiplying coefficient P (T) and the T-channel input data W (INT)), which has been stored in the register (MR) 150, is supplied to the other input terminal one of the adder/subtractor 146 through the gate 148. Both data are added to each other at the adder/subtractor 146, and the sum of both data is stored in the register (AR) 151. Through these processes, a process having a function equivalent to the function of the adder 206 of FIG. 4 is realized.

At the same step S504, processes similar to a part of the process at step S503 are executed. That is, the T-channel multiplying coefficient P (T) set in the register (M0) 141 at step S502 is supplied to the multiplier 145, and the T-channel input data W (INT) set in the register (M1) 142 is supplied through the gate 147 to the multiplier 145. At the multiplier 145, the data W (INT) is multiplied by the coefficient P (T), and the product is stored in the register (MR) 150.

Further, at the same step S504, the effector (1) output multiplying coefficient P (EF1) is read out from the coefficient memory (P) 103 and is stored in the register (M0) 141, and the effector (1) output channel data W (E02) is read out from the work memory (W) 104 and is stored in the register (M1) 142.

At step S505, the result of the calculation performed by the adder/subtractor 146, which has been stored in the register (AR) 151, is transferred to the register (SR) 152 through the clipper circuit 152, and the result of the calculation performed at step S504 (that is, the product of the T-channel multiplying coefficient P (T) and T-channel input data W (INT)), which has been stored in the register (MR) 150, is transferred to the register (AR) 151 through the gate 148 and the adder/subtractor 146.

Further, the effector (1) output multiplying coefficient P (EF1), which has been set in the register (M0) 141 at step S504, is supplied to the multiplier 145, and the effector (1) output channel data W (EO2) set in the register (M1) 142 is supplied to the multiplier 145 through the gate 147. The product of both data obtained by the multiplier 145 is stored in the register (MR) 150. Through these processes, a process having a function equivalent to the function of the multiplier 207 of FIG. 4 is realized.

At step S506, the data stored in the register (SR) 153 is stored as an effector (2) input channel data (1) W (FI1) via the internal bus 123 at a relevant address of the work memory (W) 104.

Further, at step S506, the product obtained at step S505 by the multiplier 145 (the product of the effector (1) output multiplying coefficient P (EF1) and the effector (1) output channel data W (E02)), which has been stored in the register (MR) 150, is transferred through the gate 148 to one of the input terminals of the adder/-subtractor 146, and the product of the T-channel multiplying coefficient P (T) and the T-channel input data W (INT) obtained by the multiplier 145 is transferred through the gate 149 to the other input terminal of the adder/subtractor 146. The sum obtained by the adder/-subtractor 146 is stored in the register (MR) 151. Through the above processes, a process having a function equivalent to the function of the adder 208 of FIG. 4 is realized.

At step S507, the result of the calculation performed by the adder/subtractor 146, which has been stored in the register (AR) 151, is stored in the register (SR) 153 through the clipper circuit 152, and at step S508, the data stored in the register (SR) 153 is stored as an effector (2) input channel data (2) W (FI2) via the internal bus 123 at a relevant address of the work memory (W) 104.

Through these processes, a process having a function equivalent to the function of the mixing process (2A) 203 of FIG. 4 is realized.

FIG. 10 is a view showing the mixing process (3A) in detail.

At step S601 of FIG. 10, the L-channel multiplying coefficient P (PL1) is read out from the coefficient memory (P) 103 and is stored in the register (M0) 141, while the L-channel input data W (INL) is read out from the work memory (W) 104 and is stored in the register (M1) 142.

At step S602, the L-channel multiplying coefficient P (PL1) set in the register (M0) 141 is supplied to the multiplier 145, and the L-channel input data W (INL) set in the register (M1) 142 is supplied through the gate 147 to the multiplier 145. At the multiplier 145, the data W (INL) is multiplied by the coefficient P (PL1), and the product is stored in the register (MR) 150. In this way, a process having a function equivalent to the function of the multiplier 216 of FIG. 4 will be realized through the above processes.

Further, at the same step S602, L-channel multiplying coefficient P (PLL1) is read out from the coefficient memory (P) 103 and is stored in the register (M0) 141.

At step S603, the product obtained by the multiplier 145 and stored in the register (MR) 150 is transferred to the register (AR) 151 through the gate 148 and the adder/subtractor 146.

At the same step S603, the L-channel multiplying coefficient P (PLL1) set in the register (M0) 141 is supplied to the multiplier 145, and the L-channel input data W (INL) set in the register (M1) 142 is supplied to the multiplier 145 through the gatè 147. The multiplier 145 multiplies the data W (INL) by the coefficient P (PLL1) and the product is stored in the register (MR) 150. Through these processes, a process having a function equivalent to the function of the multiplier 215 of FIG. 4 is realized.

Further at the same step S603, the effector (2) output multiplying coefficient P (FL) is read out from the coefficient memory (P) 103 and is stored in the register (M0) 141, while an effector (1) output channel data (1) W (FO1) is read out from the work memory (W) 104 and is stored in the register (M1) 142.

At the following step S604, the product obtained by the multiplier 145, which has been stored in the register (AR) 151, is stored in the register (SR) 153 through the clipper circuit 152. Note that the data stored in the register (SR) 153 will be stored as 1-channel output data W (OT1) via the internal bus 123 at a relevant address of the work memory (W) 104 at the following step S605, and thereafter the data stored in the work memory (W) 104 will be output through an output process to be described later. Through these processes, a process having a function equivalent to the function of the multiplier 216 of FIG. 4 is realized.

At the same step S604, the product (the product of the L-channel multiplying coefficient P (PLL1) and the L-channel input data W (INL)) obtained by the multiplier 145 and stored in register (MR) 150 is transferred to the register (AR) 151 through the gate 148 and the adder/subtracter 146.

The effector (2) output multiplying coefficient P (FL) set in the register (M0) 141 is supplied to the multiplier 1.45, and the effector (1) output channel data (1) W (FO1) is supplied through the gate 147 to the multiplier 145. The multiplier 145 multiplies the data (1) W (FO1) by the coefficient P (FL) and the product is stored in the register (MR) 150. Through these processes, a process having a function equivalent to the function of the multiplier 211 of FIG. 4 is realized.

Further at the same step S604, R-channel multiplying coefficient P (R1) is read out from the coefficient memory (P) 103 and is stored in the register (M0) 141 while R-channel input data W (INR) is read out from the work memory (W) 104 and is stored in the register (M1) 142.

At the following step S605, as described above, the data stored in the register (SR) 153 is stored as 1-channel output data W (OT1) via the internal bus 123 at a relevant address of the work memory (W) 104.

Then, the product obtained at step S605 by the multiplier 145 (the product of the effector (2) output multiplying coefficient P (FL) and the effector (1) output channel data (1) W (FO1)), which has been stored in the register (MR) 150, is transferred through the gate 148 to one of the input terminals of the adder/subtractor 146, and the product of the L-channel multiplying coefficient P (PLL1) and the L-channel input data W (INL) obtained by the multiplier 145 is transferred through the gate 149 to the other one of the input terminals of the adder/subtractor 146. The adder/subtractor 146 adds both data, and the sum obtained by the adder/subtractor 146 is stored in the register (AR) 151. Through the above processes, a process having a function equivalent to the function of the adder 212 of FIG. 4 is realized.

The R-channel multiplying coefficient P (R1) set in the register (M0) 141 is supplied to the multiplier 145, and the R-channel input data W (INR) is supplied through the gate 147 to the multiplier 145. The multiplier 145 multiplies the data (1) W (INR) by the coefficient P (R1) and the product is stored in the register (MR) 150. Through these processes, a process having a function equivalent to the function of the multiplier 218 of FIG. 4 is realized.

Further at the same step S605, R-channel multiplying coefficient P (RR1) is read out from the coefficient memory (P) 103 and is stored in the register (M0) 141.

At step S606, the product obtained by the multiplier 145, which has been stored in the register (AR) 151, is stored in the register (SR) 153 through the clipper circuit 152. Note that the data stored in the register (SR) 153 will be stored as L-channel output data W (OTL) via the internal bus 123 at a relevant address of the work memory (W) 104 at the following step S607, and thereafter the data stored in the work memory (W) 104 will be output through the output process to be described later. Through these processes, a process having a function equivalent to the function of the adder 212 of FIG. 4 is realized.

At the same step S606, the product (the product of the R-channel multiplying coefficient P (R1) and the R-channel input data W (INR)) obtained by the multiplier 145 and stored in register (MR) 150 is transferred to the register (AR) 151 through the gate 148 and the adder/subtracter 146.

The R-channel multiplying coefficient P (RR1) set in the register (M0) 141 is supplied to the multiplier 145 while the R-channel input data W (INR) is supplied through the gate 147 to the multiplier 145. The multiplier 145 multiplies the data W (INR) by the coefficient P (RR1) and the product is stored in the register (MR) 150. Through these processes, a process having a function equivalent to the function of the multiplier 217 of FIG. 4 is realized.

Further at the same step S606, the effector (2) output multiplying coefficient P (FR) is read out from the coefficient memory (P) 103 and is stored in the register (M0) 141 while the effector (2) output channel data (2) W (F02) is read out from the work memory (W) 104 and is stored in the register (M1) 142.

At the following step S607, as described above, the data stored in the register (SR) 153 is stored as L-channel output data W (OTL) via the internal bus 123 at a relevant address of the work memory (W) 104.

Then, the product obtained by the multiplier 145, which has been stored in the register (AR) 151, is stored in the register (SR) 153 through the clipper circuit 152. Note that the data stored in the register (SR) 153 will be stored as 2-channel output data W (OT2) via the internal bus 123 at a relevant address of the work memory (W) 104 at the following step S608, and thereafter the data stored in the work memory (W) 104 will be output through the output process to be described later. Through these processes, a process having a function equivalent to the function of the multiplier 218 of FIG. 4 is realized..

At the same step S607, the product (the product of the R-channel multiplying coefficient P (RR1) and the R-channel input data W (INR)) obtained by the multiplier 145 and stored in register (MR) 150 is transferred to the register (AR) 151 through the gate 148 and the adder/subtracter 146.

The effector (2) output channel multiplying coefficient P (FR) set in the register (M0) 141 is supplied to the multiplier 145 while the effector (2) output channel data W (FO2) is supplied through the gate 147 to the multiplier 145. The multiplier 145 multiplies the data W (FO2) by the coefficient P (FR) and the product is stored in the register (MR) 150. Through these processes, a process having a function equivalent to the function of the multiplier 213 of Fig. 4 is realized.

At the following step S608, as described above, the data stored in the register (SR) 153 is stored as 2-channel output data W (OT2) via the internal bus 123 at a relevant address of the work memory (W) 104.

Then, the product obtained at step S607 by the multiplier 145 (the product of the effector (2) output multiplying coefficient P (FR) and the effector (2) output channel data (2) W (FO2)), which has been stored in the register (MR) 150, is transferred through the gate 148 to one of the input terminals of the adder/subtractor 146, and the product of the R-channel multiplying coefficient P (RR1) and the R-channel input data W (INR)

obtained by the multiplier 145 is transferred through the gate 149 to the other one of the input terminals of the adder/subtractor 146. The adder/subtractor 146 adds both data, and the sum obtained by the adder/subtractor 146 is stored in the register (AR) 151. Through the above processes, a process having a function equivalent to the function of the adder 214 of FIG. 4 is realized.

At the following step S609, the product obtained by the multiplier 145 and stored in the register (AR) 151 is stored in the register (SR) 153 through the clipper circuit 152. Then, at step S610, data stored in the register (SR) 153 is transferred and stored as R-channel output data W (OTR) via the internal bus 123 at a relevant address of the work memory (W) 104.

Then, the data stored in the work memory (W) 104 will be output through the output process to be described later, whereby a process having a function equivalent to the function to externally supply the output of the multiplier 214 will be realized.

Through the above processes, a process having a function equivalent to that of the mixing process (3A) 210 of FIG. 4 is realized.

Figure 11:
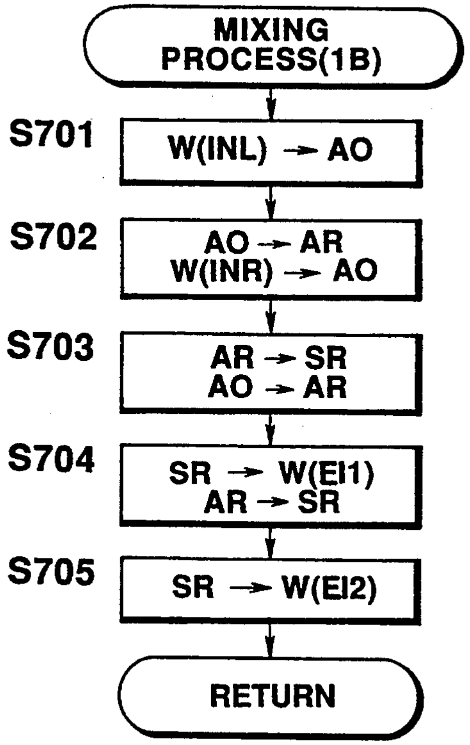
FIG. 11 is a flow chart showing a detailed operation of a mixing process (1B) in the first embodiment.
Figure 12:
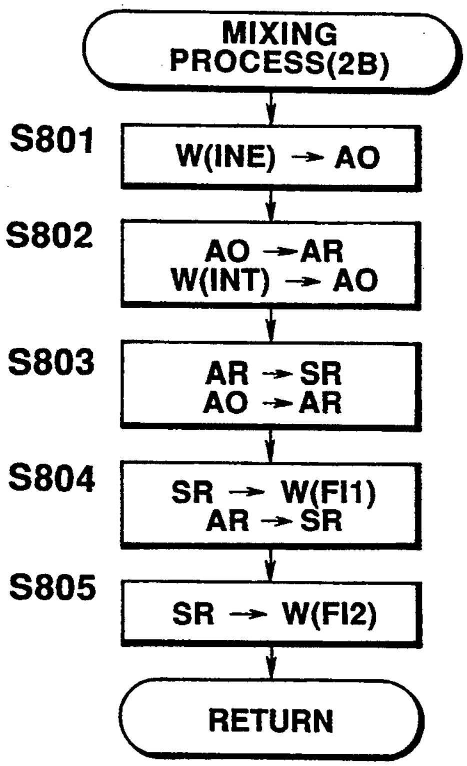
FIG. 12 is a flow chart showing a detailed operation of a mixing process (2B) in the first embodiment.
Figure 13:
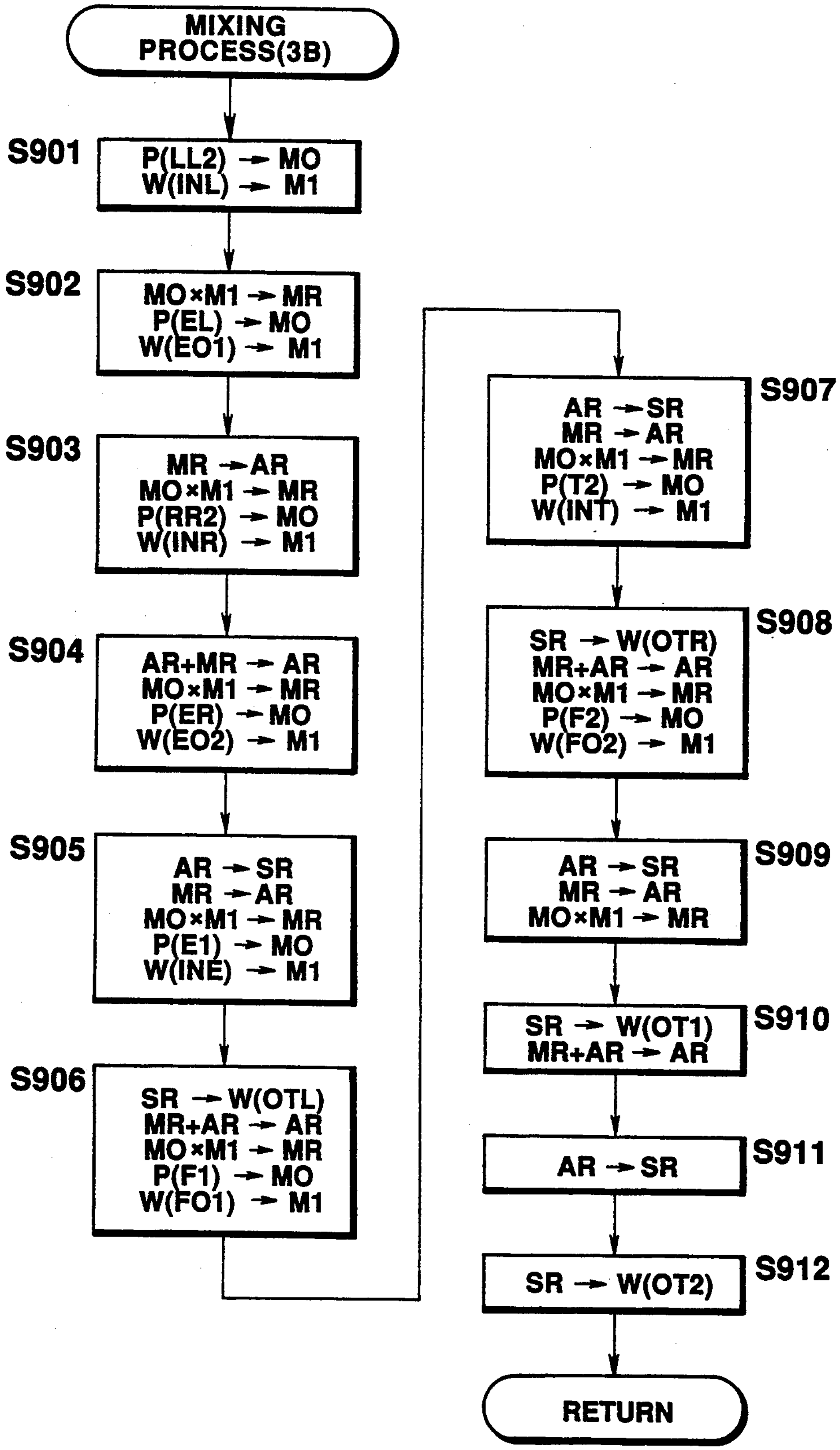
FIG. 13 is a flow chart showing a detailed operation of a mixing process (3B) in the first embodiment.

FIGS. 11 to 13 are views showing mixing processes (1B), (2B) and (3B) in detail, respectively.

FIG. 11 is a view showing the mixing process (1B) in detail. At step S701 of FIG. 11, L-channel input data W (INL) is read out from the work memory (W) 104 and is stored in a register (A0) 143, At step S702, the input data W (INL) stored in the register (A0) 143 is transferred to the register (AR) 151 through the gate 148 and the adder/subtractor 146.

At the same step S702, the R-channel input data W (INR) is read out from the work memory (W) 104 and is stored in the register (AO) 143.

At step S703, L-channel input data W (INL) transferred to the register (AR) 151 is stored in the register (SR) 153 through the clipper circuit 152, and further R-channel input data W (INR) stored in the register (A0) 143 is transferred to the register (AR) 151 through the gate 148 and the adder/subtractor 146.

At the following step S704, the former data SR (L-channel input data W (INL)) transferred to the register (SR) 153 is stored as effector (1) input channel data (1) W (EI1) via the internal bus 123 at the relevant address of the work memory (W) 104.

In the similar manner, the latter R-channel input data W (INR) transferred to the register (AR) 151 at the previous step S703 is stored in the register (SR) 153 through the clipper circuit 152.

Then, at step S705, the latter data SR (that is, R-channel input data W (INR)) previously stored in the register (SR) 153 is stored as effector (1) input channel data W (EI2) via the internal bus 123 at the relevant address of the work memory (W) 104.

Through the described processes, a function equivalent to the mixing process (1B) 301 of FIG. 5 is realized.

FIG. 12 is a flow chart of the detailed mixing process (2B).

At step S801 of FIG. 12, E-channel input data W (INE) is read out from the work memory (W) 104 and is stored in a register (A0) 143. At step S802, the input data W (INE) stored in the register (A0) 143 is transferred to the register (AR) 151 through the gate 148 and the adder/subtractor 146.

At the same step S802, the T-channel input data W (INT) is read out from the work memory (W) 104 and is stored in the register (AO) 143.

At step S803, E-channel input data W (INE) transferred to the register (AR) 151 is stored in the register (SR) 153 through the clipper circuit 152, and further T-channel input data W (INT) stored in the register (A0) 143 is transferred to the register (AR) 151 through the gate 148 and the adder/subtractor 146.

At the following step S804, the former data SR (E-channel input data W (INE)) transferred to the register (SR) 153 is stored as effector (2) input channel data (1) W (FI1) via the internal bus 123 at the relevant address of the work memory (W) 104.

In the similar manner, the latter T-channel input data W (INT) transferred to the register (AR) 151 at the previous step S803 is stored in the register (SR) 153 through the clipper circuit 152.

Then, at step S805, the latter data SR (that is, T-channel input data W (INT)) previously stored in the register (SR) 153 is stored as effector (2) input channel data (2) W (FI2) via the internal bus 123 at the relevant address of the work memory (W) 104.

Through the described processes, a function equivalent to the mixing process (2B) 304 of FIG. 5 is realized.

FIG. 13 is a flow chart of the detailed mixing process (3B).

At step S901 of FIG. 13, the L-channel multiplying coefficient P (LL2) is read out from the coefficient memory (P) 103 and is stored in the register (M0) 141 while the L-channel input data W (INL) is read out from the work memory (W) 104 and is stored in the register (M1) 142.

At the following step S902, the L-channel multiplying coefficient P (LL2) set in the register (M0) 141 is supplied to the multiplier 145 while the L-channel input data W (INL) set in the register (M1) 142 is supplied through the gate 147 to the multiplier 145. At the multiplier 145, the data W (INL) is multiplied by the coefficient P (LL2), and the product is stored in the register (MR) 150. Through the process, a process having a function equivalent to the function of the multiplier 309 of FIG. 5 will be realized.

Further, at the same step S902, the effector (1) output multiplying coefficient P (EL) is read out from the coefficient memory (P) 103 and is stored in the register (M0) 141 while the effector (1) output channel data (1) W (EO1) is read out from the work memory (W) 104 and is stored in the register (M1) 142.

At step S903, the product obtained by the multiplier 145 and stored in the register (MR) 150 is transferred to the register (AR) 151 through the gate 148 and the adder/subtractor 146.

At the same step S903, the effector (1) output multiplying coefficient P (EL) set in the register (M0) 141 is supplied to the multiplier 145 while the effector (1) output channel data W (EO1) set in the register (M1) 142 is supplied to the multiplier 145 through the gate 147. The multiplier 145 multiplies the data W (EO1) by the coefficient P (EL) and the product is stored in the register (MR) 150. Through these processes, a process having a function equivalent to the function of the multiplier 305 of FIG. 5 is realized.

Further at the same step S903, R-channel multiplying coefficient P (RR2) is read out from the coefficient memory (P) 103 and is stored in the register (M0) 141 while R-channel input data (1) W (INR) is read out from the work memory (W) 104 and is stored in the register (M1) 142.

At the following step S904, the data (the product of L-channel multiplying coefficient P (LL2) and L-channel input data W (INL)), which has been stored in the register (AR) 151, is transferred through the gate 148 to one of the input terminals of the adder/subtractor 146 while the product obtained by the multiplier 145 (that is, the product of the effector (1) output multiplying coefficient P (EL) and the effector (1) output channel data (1) W (EO1)) is transferred through the gate 149 to the other one of the input terminals of the adder/subtractor 146. The adder/subtractor 146 adds both data, and the sum obtained by the adder/subtractor 146 is stored in the register (AR) 151. Through the above processes, a process having a function equivalent to the function of the adder 306 of FIG. 5 is realized.

At the same step S904, R-channel multiplying coefficient P (RR2) set in the register (M0) 141 is supplied to the multiplier 145 while R-channel input data W (INR) set in the register (M1) 142 is supplied to the multiplier 145 through the gate 147. The multiplier 145 multiplies the data W (INR) by the coefficient P (RR2) and the product is stored in the register (MR) 150. Through these processes, a process having a function equivalent to the function of the multiplier 310 of FIG. 5 is realized.

Further, at the same step S904, the effector (1) output multiplying coefficient P (ER) is read out from the coefficient memory (P) 103 and is stored in the register (M0) 141 while the effector (1) output channel data (2) W (E02) is read out from the work memory (W) 104 and is stored in the register (M1) 142.

At the following step S905, the data (that is, the sum of the effector (1) output multiplying coefficient P (EL) and the effector (1) output channel data (1) W (EO1)), which has been stored in the register (AR) 151, is transferred and stored in the register (SR) 153 through the clipper circuit 152.

Note that the data stored in the register (SR) 153 will be stored as L-channel output data W (OTL) via the internal bus 123 at a relevant address of the work memory (W) 104 at the following step S906, and thereafter the data stored in the work memory (W) 104 will be output through the output process to be described later. Through these processes, a process having a function equivalent to the function of the adder 306 of FIG. 5 is realized.

At the same step S905, the product obtained by the multiplier 145 (that is, the product of the L-channel multiplying coefficient P (PLL1) and the L-channel input data W (INL)), which has been stored in register (MR) 150, is transferred to the register (AR) 151 through the gate 148 and the adder/subtracter 146.

The effector (1) output multiplying coefficient P (ER) set in the register (M0) 141 is supplied to the multiplier 145 while the effector (1) output channel data (2) W (E02) is supplied through the gate 147 to the multiplier 145. The multiplier 145 multiplies the data (2) W (E02) by the coefficient P (ER) and the product is stored in the register (MR) 150. Through these processes, a process having a function equivalent to the function of the multiplier 307 of FIG. 5 is realized.

Further at the same step S905, E-channel multiplying coefficient P (El) is read out from the coefficient memory (P) 103 and is stored in the register (M0) 141 while E-channel input data W (INE) is read out from the work memory (W) 104 and is stored in the register (M1) 142.

At the following step S906, as described above, the data stored in the register (SR) 153 is read out and stored as 1-channel output data W (OTL) via the internal bus 123 at a relevant address of the work memory (W) 104.

Then, the data which has been obtained and stored in the register (MR) 150 at step S905 (that is, the product of the effector (1) output multiplying coefficient P (ER) and the effector (1) output channel data (2) W (EO2)) is transferred through the gate 148 to one of the input terminals of the adder/subtractor 146 while the product which has been obtained by the multiplier 145 and transferred to the register (AR) 151 (that is, the product of R-channel multiplying coefficient P (RR2) and R-channel input data W (INR)) is transferred through the gate 149 to the other one of the input terminals of the adder/subtractor 146. The adder/subtractor 146 adds both data, and the sum obtained by the adder/subtractor 146 is stored in the register (AR) 151. Through the above processes, a process having a function equivalent to the function of the adder 308 of FIG. 5 is realized.

Further, at the same step S906, the effector (2) output multiplying coefficient P (F1) is read out from the coefficient memory (P) 103 and is stored in the register (M0) 141 while the effector (2) output channel data (1) W (FO1) is read out from the work memory (W) 104 and is stored in the register (M1) 142.

At the following step S907, the data which has been obtained by the multiplier 145 and stored in the register (AR) 151 is read out and stored in the register (SR) 153 through the clipper circuit 152. Note that the data stored in the register (SR) 153 will be stored as R-channel output data W (OTR) via the internal bus 123 at a relevant address of the work memory (W) 104 at the following step S908, and thereafter the data stored in the work memory (W) 104 will be output through the output process to be described later. Through these processes, a process having a function equivalent to the function of the adder 308 of FIG. 5 is realized.

At the same step S907, the product which has been obtained by the multiplier 145 and stored in register (MR) 150 (that is, the product of the E-channel multiplying coefficient P (El) and the E-channel input data W (INE)) is transferred to the register (AR) 151 through the gate 148 and the adder/subtracter 146.

The effector (2) output multiplying coefficient P (F1) set in the register (M0) 141 is supplied to the multiplier 145 while the effector (2) output channel data (1) W (FO1) is supplied through the gate 147 to the multiplier 145. The multiplier 145 multiplies the data (1) W (FO1) by the coefficient P (F1) and the product is stored in the register (MR) 150. Through these processes, a process having a function equivalent to the function of the multiplier 311 of FIG. 5 is realized.

Further at the same step S907, T-channel multiplying coefficient P (T2) is read out from the coefficient memory (P) 103 and is stored in the register (M0) 141 while T-channel input data W (INT) is read out from the work memory (W) 104 and is stored in the register (M1) 142.

At the following step S908, as described above, the data stored in the register (SR) 153 is read out and stored as R-channel output data W (OTR) via the internal bus 123 in the work memory (W) 104 at a relevant address.

Then, the data which has been obtained and stored in the register (MR) 150 at step S907 (that is, the product of the effector (2) output multiplying coefficient P (F1) and the effector (2) output channel data (1) W (FO1)) is transferred through the gate 148 to one of the input terminals of the adder/subtractor 146 while the product which has been obtained by the multiplier 145 and transferred to the register (AR) 151 (that is, the product of E-channel multiplying coefficient P (El) and E-channel input data W (INE)) is transferred through the gate 149 to the other one of the input terminals of the adder/-subtractor 146. The adder/subtractor 146 adds both data, and the sum obtained by the adder/subtractor 146 is stored in the register (AR) 151. Through the above processes, a process having a function equivalent to the function of the adder 312 of FIG. 5 is realized.

The T-channel multiplying coefficient P (T2) set in the register (M0) 141 is read out and transferred to the multiplier 145 while T-channel input data W (INT) set to the register (M1) 142 is transferred through the gate 147 to the multiplier 145. The multiplier 145 multiplies both the transferred data, and the resultant product is stored in the register (MR) 150. Through these processes, a process having a function equivalent to that of the multiplier 316 of FIG. 5 is realized.

Further, at the same step S908, the effector (2) output multiplying coefficient P (F2) is read out from the coefficient memory (P) 103 and is stored in the register (M0) 141 while the effector (2) output channel data (2) W (F02) is read out from the work memory (W) 104 and is stored in the register (M1) 142.

At the following step S909, the data which has been obtained by the multiplier 145 and stored in the register (AR) 151 is read out and stored in the register (SR) 153 through the clipper circuit 152. Note that the data stored in the register (SR) 153 will be transferred to and stored as 1-channel output data W (OT1) via the internal bus 123 in the work memory (W) 104 at a relevant address at the following step S910, and thereafter the data stored in the work memory (W) 104 will be output through the output process to be described later. Through these processes, a process having a function equivalent to the function of the adder 312 of FIG. 5 is realized.

At the same step S909, the product which has been obtained by the multiplier 145 and stored in register (MR) 150 (that is, the product of the T-channel multiplying coefficient P (T2) and the T-channel input data W (INT)) is transferred to the register (AR) 151 through the gate 148 and the adder/subtracter 146.

The effector (2) output multiplying coefficient P (F2) set in the register (M0) 141 is supplied to the multiplier 145 while the effector (2) output channel data (2) W (F02) is supplied through the gate 147 to the multiplier 145. The multiplier 145 multiplies the data (1) W (F02) by the coefficient P (F2) and the product is stored in the register (MR) 150. Through these processes, a process having a function equivalent to the function of the multiplier 313 of FIG. 5 is realized.

At the following step S910, as described above, the data stored in the register (SR) 153 is read out and stored as 1-channel output data W (OT1) via the internal bus 123 in the work memory (W) 104 at a relevant address.

Then, the data which has been obtained and stored in the register (MR) 150 at step S909 (that is, the product of the effector (2) output multiplying coefficient P (F2) and the effector (2) output channel data (2) W (FO2)) is transferred through the gate 148 to one of the input terminals of the adder/subtractor 146 while the product which has been obtained by the multiplier 145 and transferred to the register (AR) 151 (that is, the product of T-channel multiplying coefficient P (T2) and T-channel input data W (INT)) is transferred through the gate 149 to the other one of the input terminals of the adder/-subtractor 146. The adder/subtractor 146 adds both data, and the sum obtained by the adder/subtractor 146 is stored in the register (AR) 151. Through the above processes, a process having a function equivalent to the function of the adder 314 of FIG. 5 is realized.

At the following step S911, the sum which has been obtained by the adder/subtractor 146 and stored in the register (AR) 151 is read out and stored in the register (SR) 153 through the clipper circuit. 152. Data to be stored in the register (SR) 153 at step S912 will be transferred to and stored as 2-channel output data W (OT2) via the internal bus 123 in the work memory (W) 104 at a relevant address.

The data which is stored in the work memory (W) 104 will be output through an output process as will be described later. Through these processes, a process having a function equivalent to the function of the adder 314 of FIG. 5 is realized.

Through the above processes, a function equivalent to the function of the mixing process (3B) 303 is realized.

FIG. 14 is a flow chart of the output process executed at step S207.

In FIG. 14, at step S1001, the L-channel output data W (OTL) is read out from the work memory (W) 104 and is stored in the output register (OR1) 154. The data stored in the output register (OR1) 154 is further supplied to D/A convertor 8 of FIG. 1. Through these processes, a process having a functions which output data from the adders 214 of FIG. 4 and 312 of FIG. 5 is realized.

At step S1002, the R-channel output data W (OTR) is read out from the work memory (W) 104 and is stored in the output register (OR2).155. The data stored in the output register (OR2) 155 is further supplied to D/A convertor 9 of FIG. 1. Through these processes, a process having a function which outputs data from the adders 214 of FIG. 4 and 308 of FIG. 5 is realized.

At step S1003, the 1-channel output data W (OT1) is read out from the work memory (W) 104 and is stored in the output register (OR1) 154. The data stored in the output register (OR1) 154 is further supplied to D/A convertor 8 of FIG. 1. Through these processes, a process having a function which outputs data from the multipliers 216 of FIG. 4 and adder 312 of FIG. 5 is realized.

At step S1004, the 2-channel output data W (OT2) is read out from the work memory (W) 104 and is stored in the output register (OR2) 155. The data stored in the output register (OR2) 155 is further supplied to D/A convertor 9 of FIG. 1. Through these processes, a process having a function which outputs data from the multipliers 210 of FIG. 4 and adder 314 of FIG. 5 is realized.

The present embodiment uses DSP (a digital signal processor) for the effect adding process in which an audio signal is processed in a digital fashion. With use of a combination of such DSP and other digital signal processing device, various musical tones other than the above musical tone signals, which are generated by an electronic musical instrument, may be applied with sound effects.

The embodiment has been described, in which the effect adding apparatus according to the present invention is applied to an electronic musical instrument, but the embodiment is simply illustrative and not restrictive. The effect adding apparatus of the invention may be applied to other audio equipment other than an electronic musical instrument in a wide variety of fields.

Now, the second embodiment of the present invention will be described.

FIGS. 17 to 40 are views showing the second embodiment of the effect adding apparatus according to the present invention.

Figure 17:
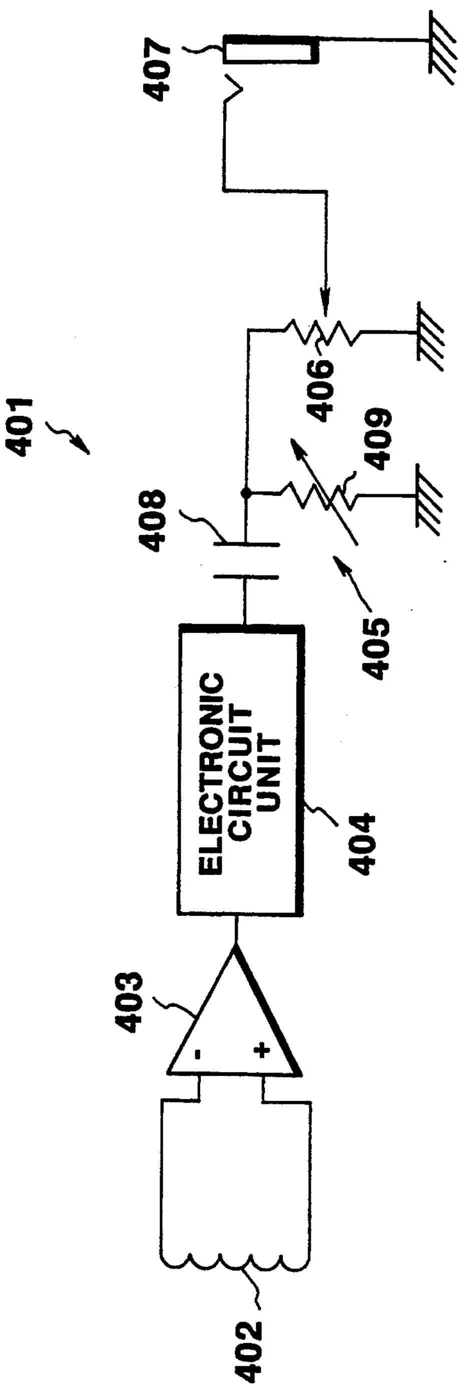
FIG. 17 is a view showing a general circuit structure of an electronic stringed instrument cited as a second embodiment of the present invention.

FIG. 17 is a view showing a general circuit diagram of the effect adding apparatus applied to an electronic stringed instrument 401. In FIG. 17, the electronic stringed instrument 401 is provided with a pick-up unit 402, an operational amplifier 403, electronic circuit unit 404, a tone control unit 405, a volume control unit 406 and an output terminal 407.

In the electronic stringed instrument 401, the pick-up unit 402 detects string vibrations, and the operational amplifier 403 amplifies the string vibrations detected by the pick-up unit 402 and supplies the amplified string vibrations (a string vibration signal) to the electronic circuit units 404 as an analog input audio signal. The electronic circuit unit 404 subjects the received audio signal to a sound effect adding process and outputs an output signal to the tone control unit 405. The tone control unit 404 subjects the received audio signal to a tone control process and supplies the tone-controlled audio signal to the volume control unit 406. The volume control unit 406 controls a level of the received audio signal and outputs the audio signal through the output terminal 407.

The tone control unit 405 is composed of a capacitor 403 and a variable resistor 409. The adjusting the variable resistor, the tone of the input audio signal is controlled.

The electronic circuit unit 404 is provided with A/D convertors 411, 412, DSP 413, D/A convertors 414, 415, a micro computer 416, a distortion circuit 417 and a console 418.

The DSP 413 is provided with two input terminals Ei, Ai and two output terminals Eo, Ao. In the DSP 413, an input audio signal is subjected to an effect adding process and then is output, or the input audio signal is directly output without being subjected to the effect adding process. The DSP 413 receives an input audio signal WIN from the A/D convertor 411 at its input terminal Ei while it receives a signal from the A/D convertor 412 at its input terminal Ai. The DSP 413 outputs from its output terminal Eo an output signal as a final output signal to the D/A convertor 414, or outputs from its output terminal Ao the output signal as a signal for an analog effect adding process to the D/A convertor 415.

Receiving a digital signal from the DSP 413, the D/A convertor 415 converts the received digital signal into an analog signal, and outputs the analog signal to the distortion circuit 417.

Figure 19:
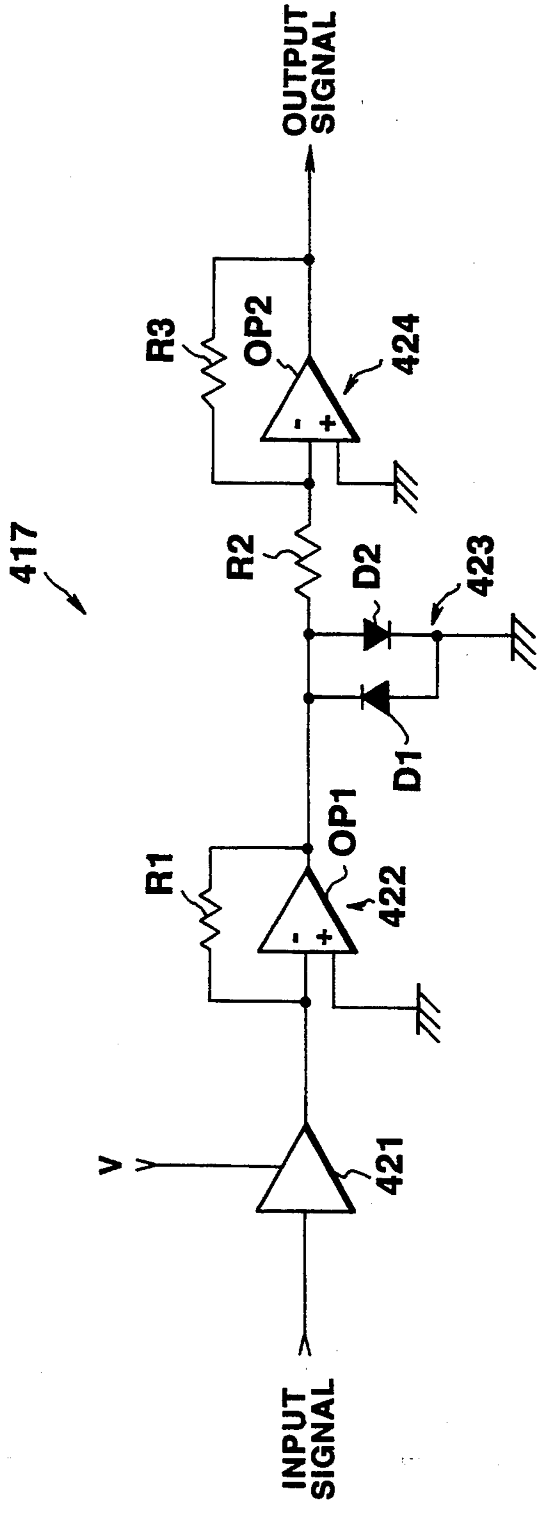
FIG. 19 is a circuit diagram of a distortion circuit shown in FIG. 18.

As shown in FIG. 19, the distortion circuit 417 comprises a buffer circuit 421, an amplifier circuit 422, a clippin circuit 423 and an amplifier circuit 424.

An input signal input from the D/A convertor 415 is supplied to the amplifier circuit 422 through the buffer 421. The gain of the buffer circuit 421 is controlled by a signal (a voltage V) input from the micro computer 416. The gain of the buffer circuit 422 adjusts a clipping level of the clipping circuit 423 to be described later.

The amplifier circuit 422 is composed of an operational amplifier OP1 and a resister R1. The amplifier circuit 422 amplifies the signal supplied from the buffer circuit 421 and outputs it to the clipping circuit 423.

The clipping circuit 423 is composed of two diodes D1, D2, which are connected to each other in parallel and in opposite polarity. The clipping circuit 423 clips the input signal at both the positive and the negative portion, and then supplies the clipped signal to the amplifier circuit 424. More specifically, the positive portion of the input signal supplied from the amplifier circuit 422 is clipped at a threshold level of the diode D2 while the negative portion of the input signal is clipped at a threshold level of the diode D1. The clipping circuit 423 clips the signal from the amplifier circuit 422 with the diodes D1, D2 to distort a waveform of the input signal, and outputs a signal with waveform distorted (a distorted-waveform signal to the amplifier circuit 424.

The amplifier circuit 424 is composed of an operational amplifier OP2 and resisters R2, R3. The amplifier circuit 424 amplifies the distorted-waveform signal supplied from the clipping circuit 423 and outputs the amplified signal to the A/D convertor 412 of FIG. 18.

Figure 18:
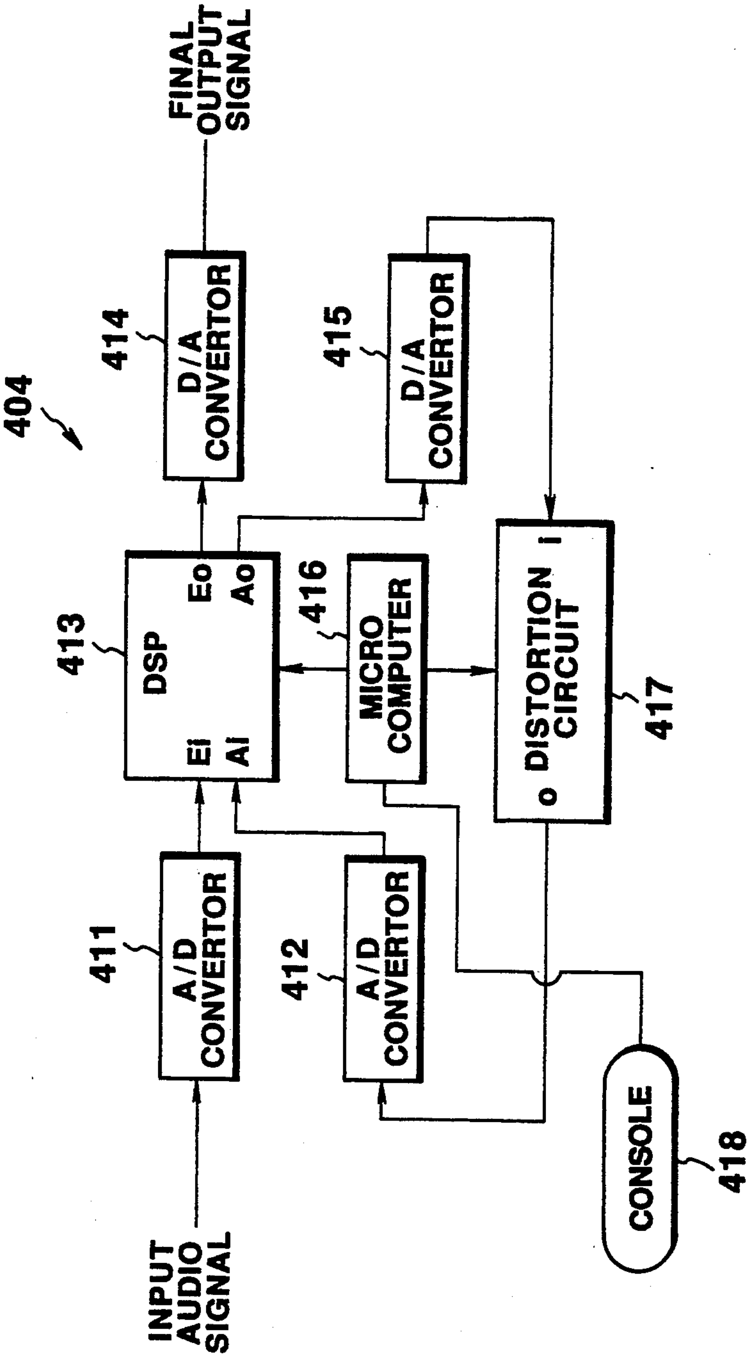
FIG. 18 is a block diagram of an electronic circuit portion shown in FIG. 17.

In FIG. 18, the A/D convertor 412 converts the analog signal supplied from the distortion circuit 417 into a digital signal, and outputs the digital signal to the input terminal Ai of the DSP 413.

Meanwhile, the A/D convertor 411 receives the string vibration signal (an input analog audio signal) detected by the pick-up unit 402 through the operational amplifier 403, and converts the analog audio signal into a digital audio signal WIN, supplying the same to the DSP 413.

The D/A convertor 414 receives a digital signal from DSP 413 and converts the signal into an analog signal, outputting the same as the final output signal to the tone control unit 405 of FIG. 17.

The micro computer 416 comprises a CPU, ROM and RAM, and controls individual components of the electronic circuit unit 404, executing a process as the effect adding unit. More specifically, the micro computer 416 stores a program as an effect circuit, other necessary data and coefficients in ROM, and uses RAM as a work area. The micro computer 416 transfers the program in ROM to DSP 413, allowing DSP 413 to perform the effect adding process, and outputs a clipping level adjusting signal (a clipping voltage: V) to the distortion circuit 417, controlling a distortion process performed by the distortion circuit 417.

The console 418 is provided with various switches and knobs which are operated by a player of a musical instrument when he plays the musical instrument. In particular, involved are a mode selecting switch for selecting a mode and a volume knob for controlling a distortion level of the distortion circuit 417.

DSP 413 performs various sorts of effect adding processes such as a reverberation, a chorus and a delay process. Which processes among these effect adding processes should be performed and in which order the processes should be performed are decided in accordance with the micro program, data and coefficients transferred from the micro computer 416.

Figure 20:
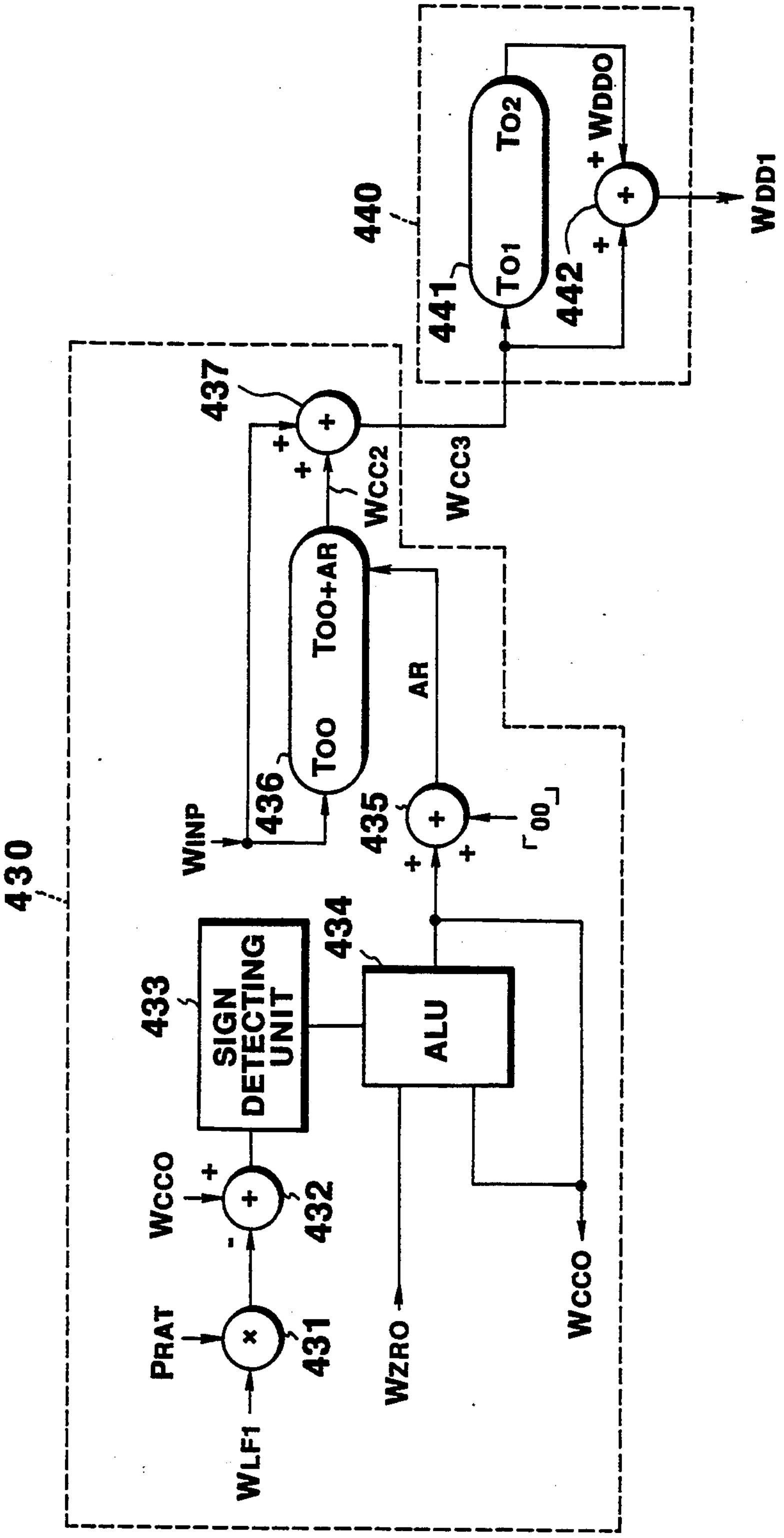
FIG. 20 is a diagram schematically showing a chorus process and a delay process of the DSP of FIG. 18.

In case that, for example, the chorus process and the delay process are performed, DSP 413 forms a chorus processing portion 430 and a delay processing portion 440, as illustrated in FIG. 20 with schematic processing blocks.

The chorus processing portion 430 comprises a multiplier 431, an adder 432, a sign detecting unit 433, an ALU (Arithmetic and Logic Unit) 434, an adder 435, a delay unit 436 and an adder 437 while the delay processing unit 440 comprises a delay unit 441 and an adder 42.

In the chorus processing unit 430, a saw-tooth wave is generated by the multiplier 431, adder 432, sign detecting unit 433, ALU 434 and adder 435. The delay unit 436 successively delays the input signal Winp based on the generated saw-tooth wave, and adds the delayed input signal Winp to the original input signal Winp (not delayed input signal) and outputs the resultant signal as a chorus output signal to the delay processing unit 440. More specifically, a saw-tooth wave rate Wlf1 and a saw-tooth wave rate PRAT are input to the multiplier 431 of the chorus processing unit 430. The multiplier 431 performs a multiplying operation on the input saw-tooth wave rates Wlf1 and Prat and outputs the resultant product to the adder 432. A saw-tooth wave rate Wcc0 is input to the adder 432. The adder 432 subtracts the product of the multiplier 431 from the saw-tooth wave rate Wcc0 and outputs the difference to the sign detecting unit 433. The sign detecting unit 433 detects a sign of the input difference, and instructs, based on the result of the detection, an operation to be performed by ALU 434. If the sign detecting unit 433 detects "a positive sign", then ALU 434 adds a constant WZRO of a value (0) to the result of the previous operation, outputting the sum. If the sign detecting unit 433 detects "a negative sign", the ALU 434 subtracts the result of the previous operation from the constant WZRO, outputting the difference. The result of the operation performed by ALU 434 is output as the saw-tooth wave rate Wcc0 to the adder 432, and is output to the adder 435. The adder 435 adds "00" to the saw-tooth wave rate Wcc0, and outputs the sum as a saw-tooth wave to the delay unit 438.

Meanwhile, the input signal Winp is input to the delay unit 436. The delay unit 436 delays the input signal Winp by a predetermined delay time TOO and further delays the same by a time based on the saw-tooth wave, and then outputs the delayed signal Winp as the delayed chorus output signal Wcc2 to the adder 437. The input signal Winp is input to the adder 437. The adder 437 adds the input signal Winp delayed by the delay unit 436 and the original input signal Winp (not delayed signal) together, and outputs the resultant signal as a chorus output signal Wcc3 to the delay processing unit 440.

The delay processing unit 440 delays the chorus output signal Wcc3 of the chorus processing unit 430 by a predetermined time, outputting the same signal. More specifically, the chorus output signal Wcc3 of the chorus processing unit 430 is input to the delay unit 441 and the adder 442. The delay unit 441 delays the chorus output signal Wcc3 by a predetermined time, and outputs the same as a delayed output signal Wdd0 to the adder 442. The adder 442 adds the chorus output signal Wcc3 and the delayed output signal Wdd0 together, and outputs the sum as a delayed output signal Wdd1.

Figure 21:
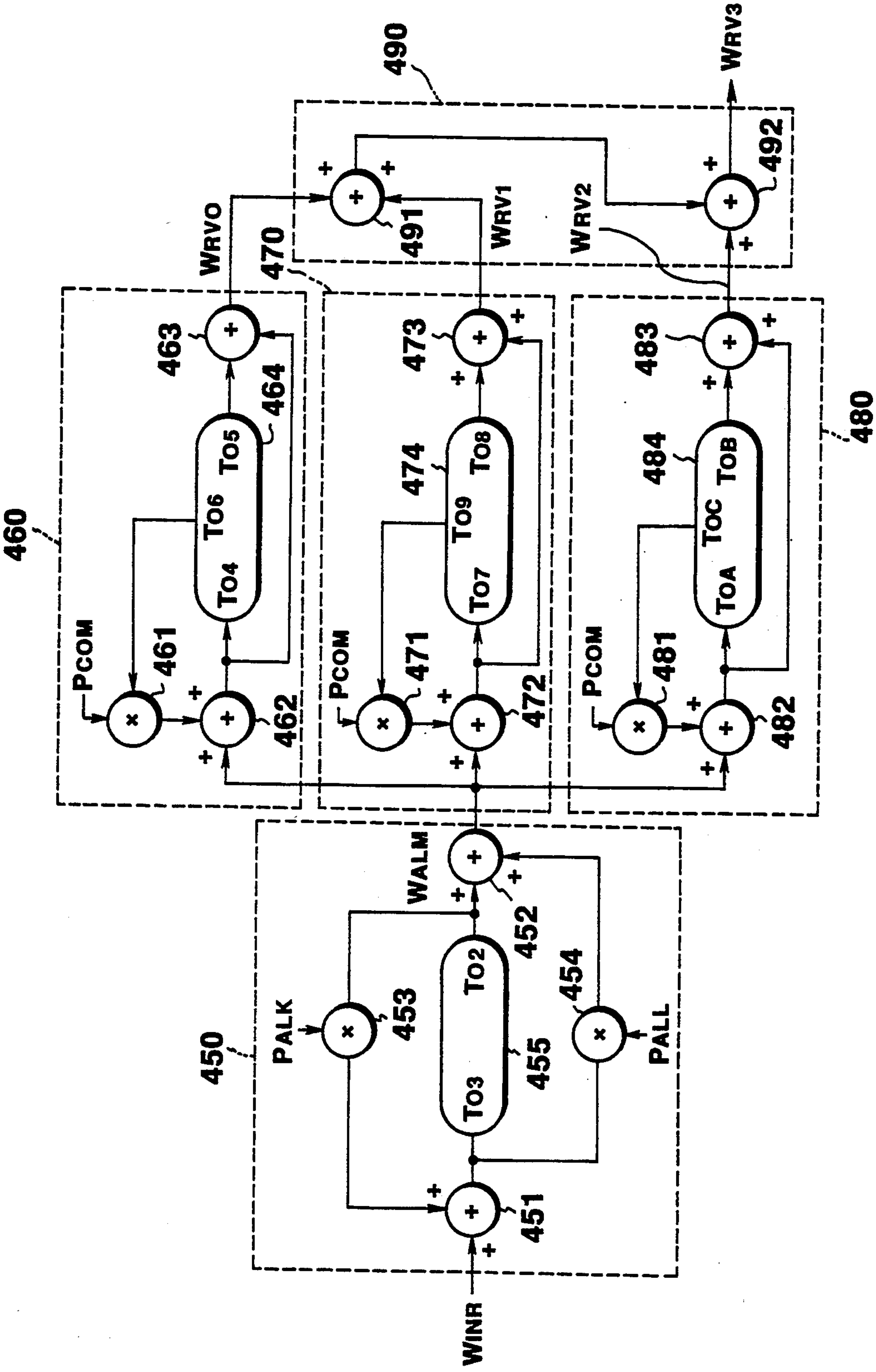
FIG. 21 is a diagram schematically showing a reverberation of the DSP of FIG. 18.

When DSP 413 executes the effect adding process for applying the reverberation effect to an audio signal, DSP 413 forms an all pass filter 450, a comb filter A 460, a comb filter B 470 and a comb filter C 480, and a mixing process unit 490, as schematically illustrated in FIG. 21.

The all pass filter 450 comprises adders 451, 452, multipliers 453, 454 and a delay unit 455. The input signal Winr and the output signal of the multiplier 453 are input to the adder 451. The adder 451 adds the input signal Winr and the product obtained by the multiplier 453 together, outputting the sum to the delay unit 455 and the multiplier 454. The delay unit 455 delays the sum obtained by the adder 451 by a predetermined time, outputting the same to adder 452 and the multiplier 453. A coefficient of all pass filter Palk is input to the multiplier 453. The multiplier 453 multiplies the output signal of the delay unit 455 by the coefficient Palk, outputting the product to adder 451. The coefficient of all pass filter PALL is input to the multiplier 454. The multiplier 454 multiplies the output signal of the adder 451 by the coefficient PALL, outputting the product to adder 452. The adder adds the output signal of the delay unit 455 and the output signal of the multiplier 454 together, and outputs the sum as an all pass filter output signal WALM to the comb filters 460, 470, 480.

The comb filter A 460 is composed of a multiplier 461, adders 462, 463 and delay unit 464. The above all pass filter output signal WALM is input to the adder 462. The output signal of the multiplier 461 is input to the adder 462. The adder 462 adds the all pass filter output signal WALM and the output signal of the multiplier 461 together, outputting the sum to the delay unit 464 and the adder 463. The delay unit 464 delays the sum of the adder 462 by a predetermined time, outputting the same to the multiplier 461, and also to the adder 463. A comb filter coefficient PCOM is input to the multiplier 461. The multiplier 461 multiplies the signal from the delay unit 464 by the comb filter coefficient PCOM, outputting the product to the adder 462. The adder 463 adds the sum calculated by the adder 462 and the output signal of the delay unit 464 together, outputting the resultant sum as a comb filter A output signal WRV0 to the mixing process unit 490.

The comb filter B470 is composed of a multiplier 471, adders 472, 473 and delay unit 474. The comb filter B 470 executes processes similar to those executed by the comb filter A 460, outputting the resultant signal as a comb filter B output signal. WRV1 to the mixing process unit 490.

The comb filter C 480 is composed of a multiplier 481, adders 482, 483 and delay unit 484. The comb filter C 480 executes processes similar to those executed by the comb filter A 460, outputting the resultant signal as a comb filter C output signal WRV2 to the mixing process unit 490.

The mixing process unit 490 is composed of two adders 491, 492. The comb filter A output signal WRV0 from the comb filter A 460 and the comb filter B output signal WRV1 from the comb filter B 470 are input to the adder 491. The adder 491 adds the comb filter A output signal WRV0 and the comb filter B output signal WRV1 together, outputting the sum to the adder 492.

The comb filter C output signal WRV2 from the comb filter C 480 is input to the adder 492. The adder 492 adds the sum calculated by the adder 491 and the comb filter C output signal WRV2 together, outputting the resultant sum as a reverberation output signal WRV3.

Figure 22:
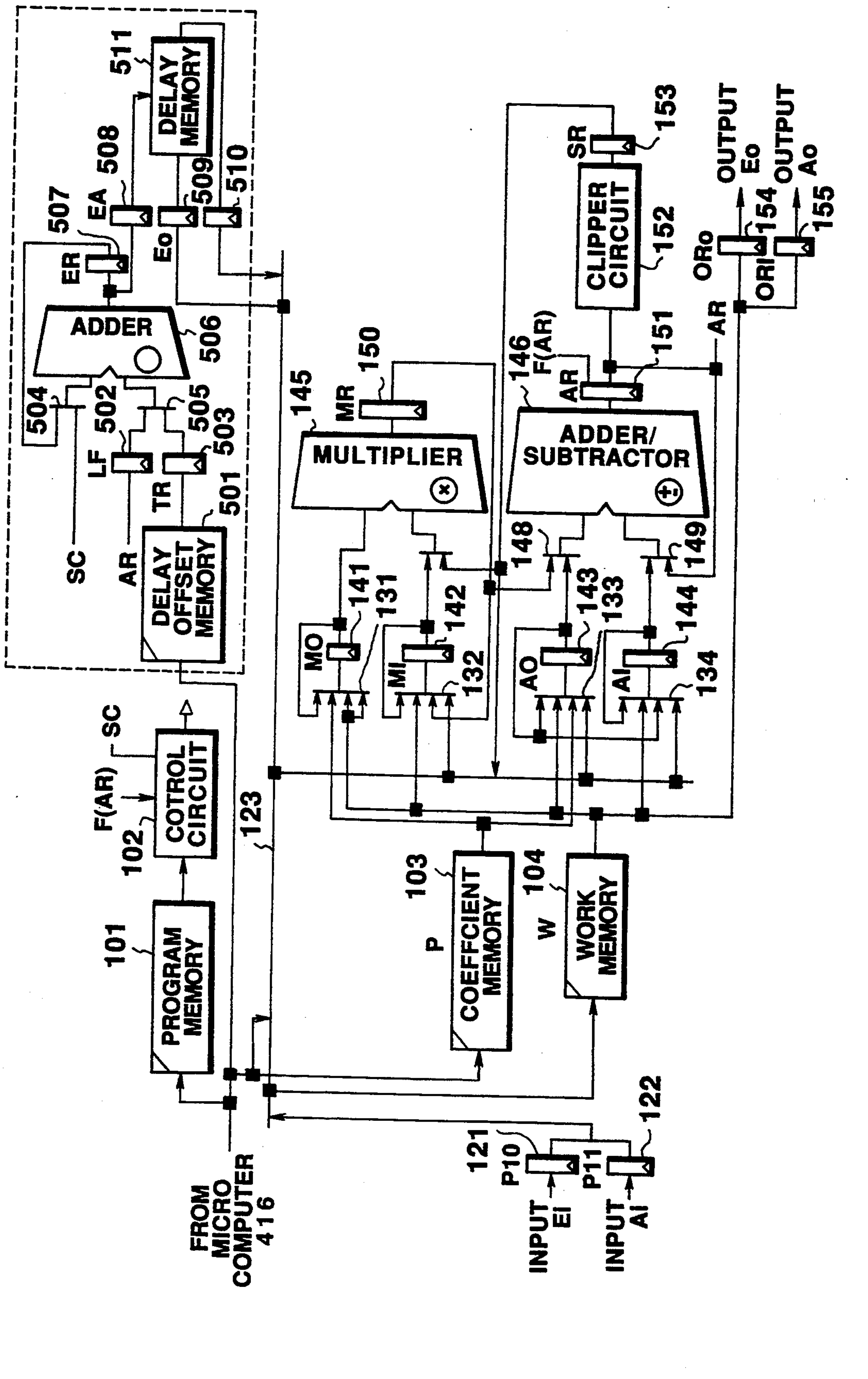
FIG. 22 is a detailed circuit diagram of the DSP of FIG. 18.

FIG. 22 is a detailed circuit diagram of DSP 413. DSP 413 has a structure similar to that of DSP 4 shown in FIG. 2 but a delay processing unit 500 is connected thereto. In FIG. 22, like components are denoted by like numerals of FIG. 2 and their further description will be omitted, except the delay processing unit 500.

FIG. 23 is a view showing contents of a coefficient memory 103 and FIG. 24 is a view showing contents of a work memory, RAM 104.

The delay processing unit 500 comprises a delay offset memory 501, a register (LF) 502, a register (TR) 503, gates 504, 505, an adder 506, a register (ER) 507, a register (EA) 508, a register (EO) 509, a register (EI) 510 and delay memory 511. The micro computer 416 writes various offset values such as TOO in the delay offset memory 501. Various offset values written in the delay offset memory 501 are set to the register (TR) 503. The offset values set in the register (TR) 503 are transferred through the gate 505 to the adder 506. A value set to the register (LF) 502 is input to the gate 505. The gate 505 alternatively outputs the values of the register (TR) 503 and the register (LF) 502 to the adder 506. A value from a register (AR) 151 is set to the register (LF) 502. Further, a value from the gate 504 is input to the adder 506. A count value SC of a counter, which is sent from a control circuit 102 is input to the gate 504, and also an output of the adder 506 is input to the gate 504 through the register (ER) 507. The gate 504 alternatively outputs these input values to the adder 506.

The adder 506 adds the values input from the gates 504 and 505, and outputs the sum to the register (ER) 507 and the register (EA) 508. The sum set to the register (EA) 508 is output to the delay memory 511 and is used for addressing of the delay memory. Meanwhile, various data from DSP 413 are input through the register (E0) 509 to the delay memory 511. The delay memory 511 reads out various data input thereto through the register (E0) 509 in accordance with the above addressing, and delays the read out data, outputting the same to the register (EI) 510. The data set to the register (EI) 510 are transferred to various units in DSP 413 via the bus 123 to be used in various effect adding processes such as the chorus effect process and the delay effect process.

Now, operation of the second embodiment will be described.

In the electronic stringed instrument 401, the pick-up unit 402 detects string vibrations and outputs an electronic signal representative of the string vibrations to the operational amplifier 403. The signal is amplified by the operational amplifier 403 and then is input to the electronic circuit unit 404. The electronic circuit unit 404 executes the effect adding process on the input signal. The signal is further transferred to the tone control unit 405 to be subjected to a tone control process, and then is transferred to an audio equipment (not shown) through the output terminal 407.

The effect adding process of the electronic circuit unit 440 is performed by the DSP 413 and the distortion circuit 417, as shown in FIG. 18. The DSP 413 is allowed to perform a plurality of effect adding processes in a predetermined order, and the distortion circuit 417 performs the distortion process during the performance of the plurality of effect adding processes, or prior to or after the performance of the effect adding processes. The order of the performance of the effect adding processes by DSP 413 and the time when the distortion process is performed are determined by operation of the mode selecting switch of the console 418 of FIG. 18. The clipping level during the distortion process of the distortion circuit 417 is determined by operation of the volume knob.

Figure 25:
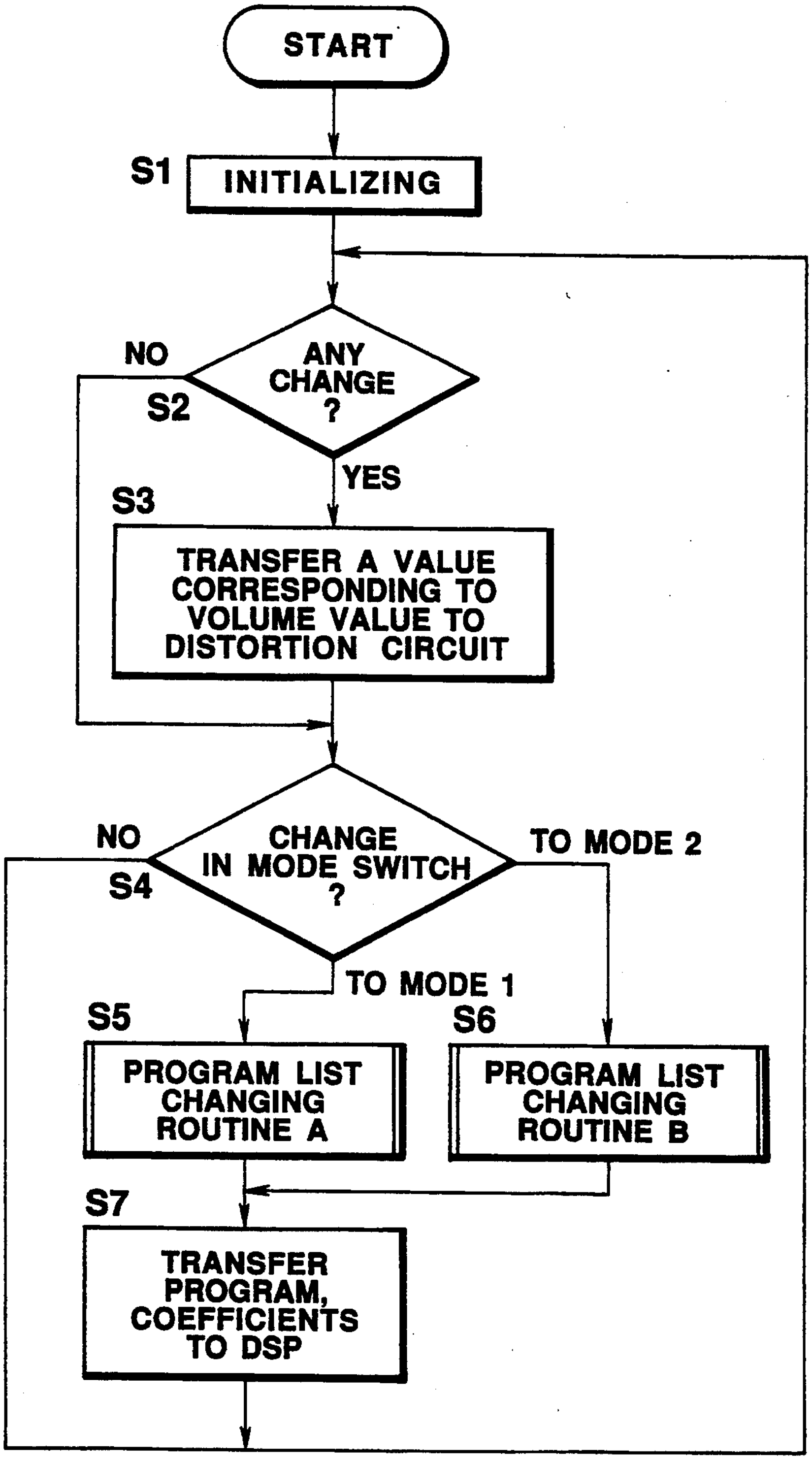
FIG. 25 is a flow chart of a mode setting process.
Figure 26:
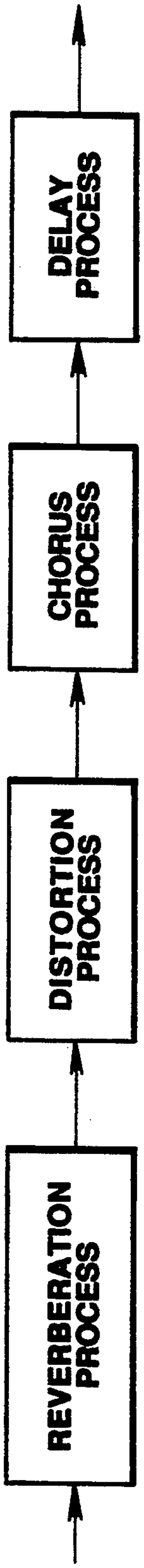
FIG. 26 is a view showing an order of execution of various effect adding processes in a mode 1.
Figure 27:
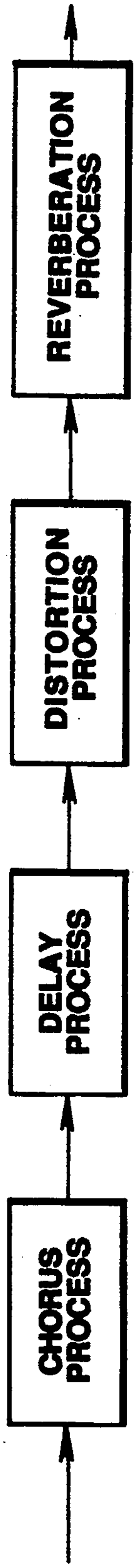
FIG. 27 is a view showing an order of execution of various effect adding processes in a mode 2.

More specifically, as shown in FIG. 25, when the electronic stringed instrument 401 is switched on, the electronic circuit unit 404 performs an initializing process at step S1, and then judges at step S2 if a volume of the console 418 is adjusted. When it is judged that the volume of the console has been adjusted, the electronic circuit unit 404 outputs at step S3 a clipping voltage corresponding to the adjusted volume value to the distortion circuit 417. Then, a setting state of the mode selecting switch of the console 418 is checked at step S4. When it is judged at step S2 that the volume of the console has been adjusted, the electronic circuit unit 404 goes directly to step S4, where the setting state of the mode selecting switch is checked.

The electronic stringed instrument 401 has two modes, i.e., a mode 1 and mode 2. The mode 1 is for performing the effect adding processes in the order of reverberation process, distortion process, chorus process and delay process while the mode 2 is for performing the effect adding processes in the order of chorus process, delay process, distortion process and reverberation process.

At step S4, it is judged if the setting state of the mode selecting switch has been changed.

When no change is found, the electronic circuit unit 404 judges that a mode selection has not been executed, and returns to step S2, performing the same processes. When the mode selecting switch is switched to a mode 1, a program list changing routine A is performed at step S5, transferring a relevant micro program and coefficients to DSP 413. At step S7, DSP 413 performs a relevant process. When the mode selecting switch is switched to a mode 2, a program list changing routine B is performed at step S6, transferring a relevant micro program and coefficients to DSP 413. At step S7, DSP 413 performs a relevant process. Through the above processes, DSP 413 has completed a preparation process for the effect adding process by the DSP 413, and the effect adding process by the distortion circuit 417.

Now, the program list changing routine A will be described in detail.

The program list changing routine A will be executed, where the mode selecting switch is set to the mode 1 at step S4.

Figure 28:
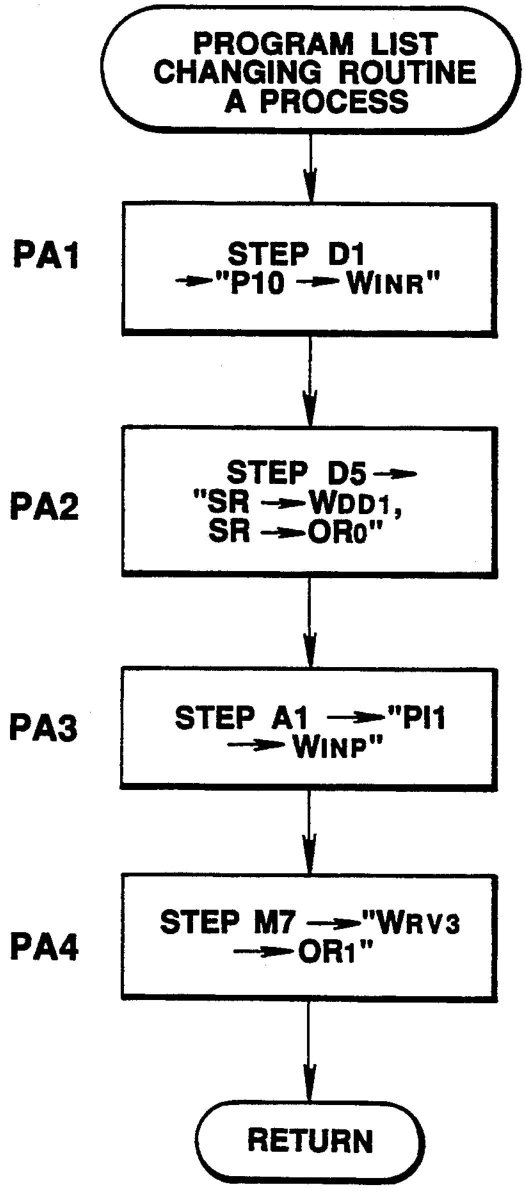
FIG. 28 is a flow chart of a program list variable routine A process in the mode 1.

The electronic circuit unit 404 enters into the program list changing routine A process shown in Fig. 28, when the mode selecting switch is set to the mode 1 at step S4 of FIG. 25. At step PA1, a process at step D1 of a digital input process to be described later is set to "PI0→Winr", that is, input data in the input register (PI0) 121 is set to be written as an input signal Winr in the work memory (W) 104 at an address 0. At step PA2, a process at step D5 of a delay process to be described later is set to "SR→Wdd1 and SR→OR0", that is, data in the register (SR) 153 is set to be written as a delay output signal Wdd1 in the work memory (W) 104 at an address 8 and data in the register (SR) 153 is set to be transferred to an output register (OR0) 154. At step PA3, a process at step A1 of an analog input process to be described later is set to "PI1→Winp", that is, input data in the input register (PI1) 122 is set to be written as an input signal Winp in the work memory (W) 104 at the address 0. At step PA4, a process at step M7 of a mixing process to be described later is set to "WRV3→OR1", that is, a reverberation output signal WRV3 at an address 13 of the work memory (W) 104 is set to be transferred to the output register (OR1) 155.

Now, the program list changing routine B process will be described in detail with reference to the flow chart of FIG. 29.

Figure 29:
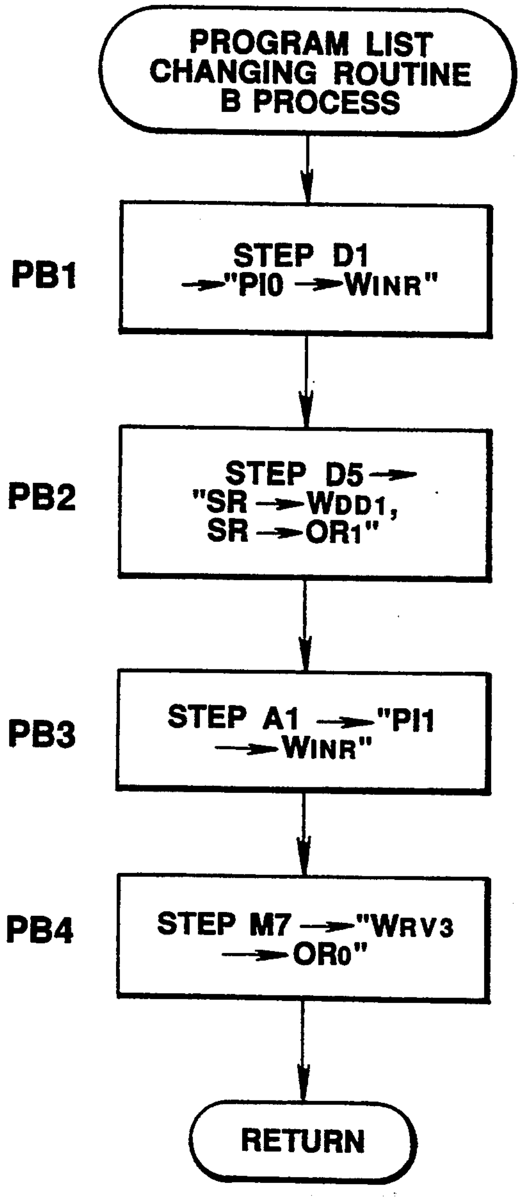
FIG. 29 is a flow chart of a program list variable routine B process in the mode 2.

The electronic circuit unit 404 enters into the program list changing routine B process shown in Fig. 29, when the mode selecting switch is set to the mode 2 at step S4 of FIG. 25. At step PB1, the process at step D1 of the digital input process to be described later is set to "PI0→Winp", that is, input data in the input register (PI0) 121 is set to be written as an input signal Winp in the work memory (W) 104 at the address 0. At step PB2, the process at step D5 of the delay process to be described later is set to "SR→Wdd1 and SR→OR1", that is, data in the register (SR) 153 is set to be written as the delay output signal Wdd1 in the work memory (W) 104 at the address 8 and data in the register (SR) 153 is set to be transferred to the output register (OR0) 154. At step PB3, the process at step A1 of the analog input process to be described later is set to "PI1→Winr", that is, input data in the input register (PI1) 122 is set to be written as the input signal Winr in the work memory (W) 104 at the address 0. At step PB4, the process at step M7 of the mixing process to be described later is set to "WRV3→ORi", that is, the reverberation output signal WRV3 at the address 13 of the work memory (W) 104 is set to be transferred to the output register (OR0) 154.

AS described above, through these program list changing routine processes, areas of the work memory (W) 104 where data are to be written respectively in the modes 1 and 2 are designated and the output registers to which the data in the work memory (W) 104 are to be transferred respectively in the modes 1 and 2 are designated. When the relevant program list changing routine process is completed in accordance with the selected mode, a micro program and coefficients are transferred to DSP 413 at step S7 of FIG. 25, and then DSP 413 executes processes.

Now, processes executed by DSP 413 will be described with reference to the flow chart of FIG. 30.

Figure 30:
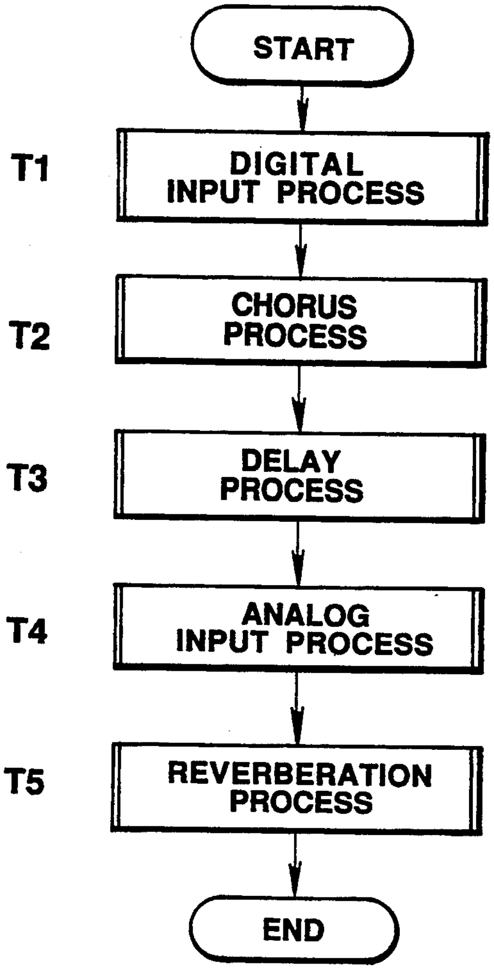
FIG. 30 is a flow chart showing an order of various processes executed by the DSP in the mode 2.

DSP 413 successively executes processes shown in FIG. 30, performing the effect adding process. More specifically, in accordance with the micro program sent from the micro computer 416, DSP 413 successively executes the digital input process at step T1, chorus process at step T2, delay process at step T3, analog input process at step T4 and reverberation process at step T5.

Now, these processes executed by DSP 413 will be described in detail.

Digital Input Process

Figure 31:
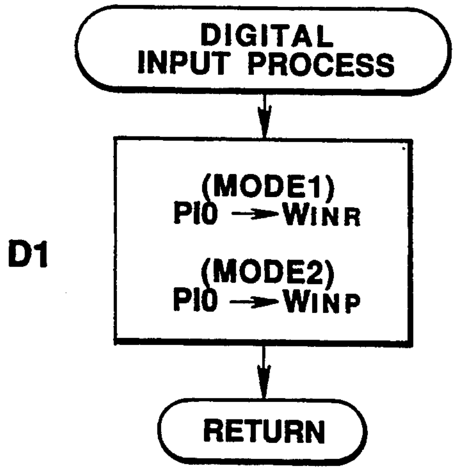
FIG. 31 is a flow chart showing detailed contents of a digital input process.

The digital input process will be described in detail with reference to the flow chart of FIG. 31.

The input audio signal Win is input to the input terminal Ei of DSP 413 from A/D convertor 411 and is sent therefrom to the input register (PI0) 121 of Fig. 22. At step D1, as shown in FIG. 31, the input audio signal Win set in the input register (PI0) 121 is written as the input signal Winr in the work memory (W) 104 at the address 1 in accordance with the program list changing routine process which is set when the mode 1 is selected while the input audio signal Win set in the input register (PI0) 121 is written as the input signal Winp in the work memory (W) 104 at the address 0 when the mode 2 is selected. The address 1 of the work memory 104 is for storing input data which is to be subjected to the reverberation effect adding process while the address 0 of the work memory is for storing input data to be subjected to the chorus effect adding process. That is, the address of the work memory (W) 104 where the input data is to be stored is selected in accordance with the selected mode. Since the mode 2 is set at the present case, the input audio signal set in the input register (PI0) 121 is written as the input signal Winp in the work memory (W) 104 at the address 0.

Chorus Process

Figure 32:
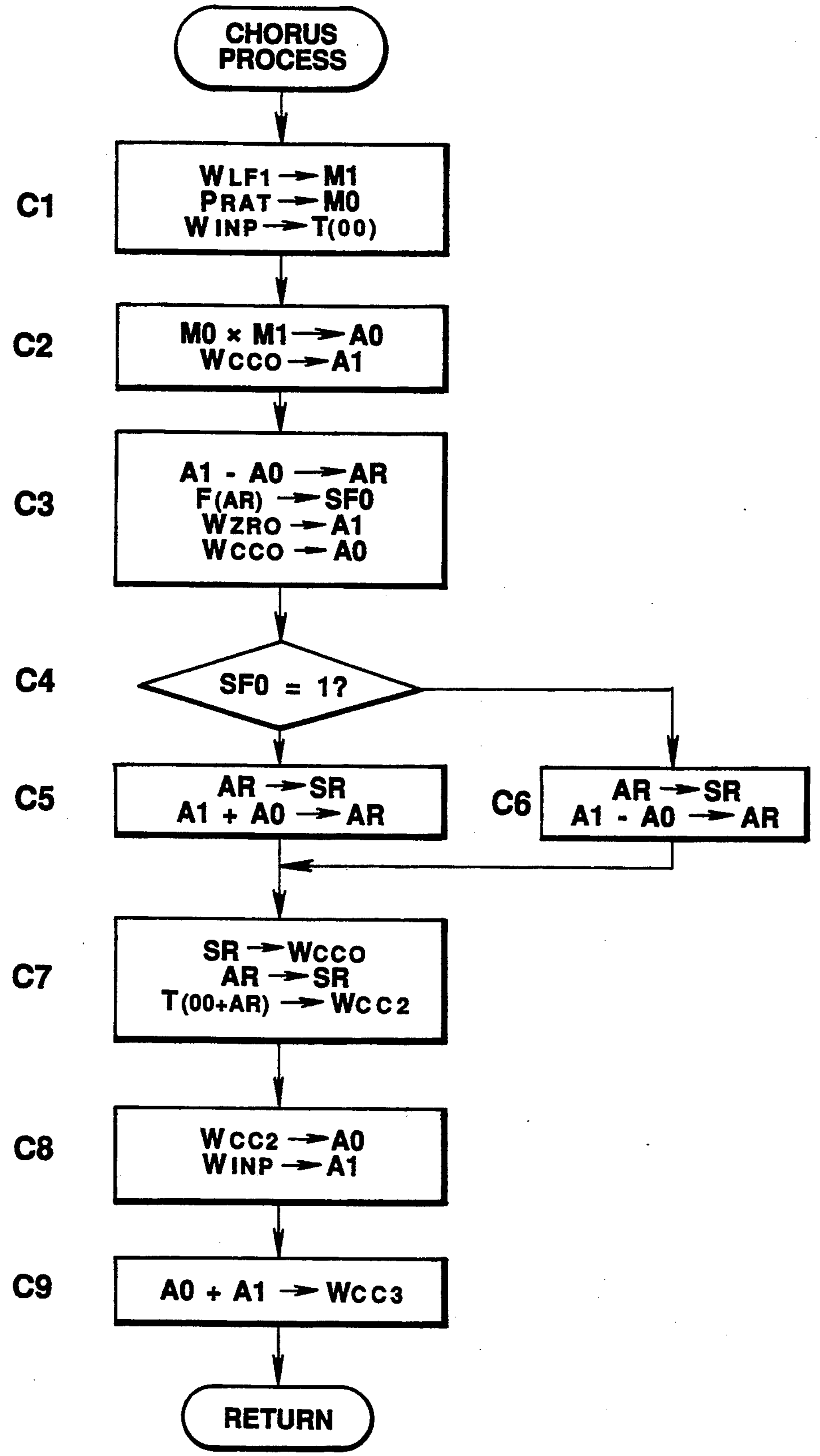
FIG. 32 is a flow chart showing detailed contents of a chorus process.

The chorus process will be described with reference to the flow chart of FIG. 32.

When an input signal is written as the input signal Winr in the work memory (W) 104 at the address 0, DSP 413 executes the chorus process.

In the chorus process, at step C1, the saw-tooth wave rate Wlf1 is read out from the work memory (W) 104 and transferred to the register (M1) 142 while the saw-tooth wave rate Prat is read out from the coefficient memory (P) 103 and transferred to the register (M0) 141. At the same step C1, the input signal Winp is read out from the work memory (W) 104 and transferred to address (00) of the delay memory 511. At the following step C2, the saw-tooth wave rate Wlf1 in the register (M1) 142 and the saw-tooth wave rate Prat in the register (M0) 141 are transferred to the multiplier 306, being subjected to a multiplication process (Wlf1 X Wrat), and the product is transferred to the register (A0) 143. At the same step C2, the saw-tooth wave rate Wcc0 is read out from the work memory (W) 104 and transferred to the register (A1) 144. At the following step C3, the saw-tooth rate Wcc0 in the register (A1) 144 and the product (Wlf1 X Prat) in the register (A0) 143 are transferred to the adder/subtractor 146, being subjected to a subtraction process. The resultant difference {Wcc0−(Wlf1 X Prat)} is transferred to the register (AR) 151. At the same step C3, a sign flag F (AR) is output as sign data SF0 from the register (AR) 151 to the control circuit 102. Further, a constant Wzro is read out from the work memory (W) 104 and transferred to the register (A1) 144 while the saw-tooth wave rate Wcc0 is also read out from the work memory (W) 104 and transferred to the register (A0) 143.

At the following step C4, it is judged if the sign data SFO is equivalent to 1 (when the sign data SFO is equivalent to 1, the data represents "negative" while when the sign data SFO is equivalent to 0, the data represents "positive"). When the sign data SFO is not equivalent to 1, i.e., the sign data represents "positive", then DSP 413 goes to step C5, where data of the register (AR) 151 is transferred to the register (SR) 153, and the constant Wzro in the register (A1) 144 and the saw-tooth wave rate Wcc0 are transferred to the adder/subtractor 146, being subjected to an adding process. The resultant sum (Wzro+Wcc0) is transferred to the register (AR) 151. Meanwhile, when the sign data SFO is equivalent to 1, i.e., the sign data represents "negative", then DSP 413 goes to step C6, where data of the register (AR) 151 is transferred to the register (SR) 153, and the constant Wzro in the register (A1) 144 and the saw-tooth wave rate Wcc0 are transferred to the adder/subtractor 146, being subjected to a subtracting process. The resultant difference (Wzro−Wcc0) is transferred to the register (AR) 151. In other words, through the processes at steps C1 to C6, the multiplier 431, the adder 432, the sign detecting unit 433 and ALU 434 in the chorus processing unit 430 shown in FIG. 20 execute processes to generate a saw-tooth wave signal.

At the following step C7, the difference {Wcc0−(Wlf1 X Prat)} obtained at step C3 and transferred to the register (SR) 153 is transferred to and stored as a saw-tooth wave rate Wcc0 in the work memory (W) 104. The sum or the difference in the register (AR) 151 is transferred to the register (SR) 153. Further, the input signal Winp transferred to the delay memory 511 is delayed by a predetermined time T00 +AR, i.e., the input signal Winp stored at the address (00 +AR) of the delay memory 511 is transferred to the work memory (W) 104, and is written as a chorus delayed output signal Wcc2 in the work memory (W) 104 at an address 5.

At the following step C8, the chorus delayed output signal Wcc2 is read out from the work memory (W) 104 and transferred to the register (A0) 143 while the input signal Winp is also read out from the work memory (W) 104 and transferred to the register (A1) 144. At step C9, the chorus delayed output signal Wcc2 in the register (A0) 143 and the input signal Winp in the register (A1) 144 are transferred to the adder/subtractor 146, being subjected to an adding process. The resultant sum (Wcc2 +Winp) is further transferred to and stored as a chorus output signal Wcc3 in the work memory at an address 6. Through the above chorus processes at steps C1 through C9, the input signal can be output which has been shifted in time based on the saw-tooth wave signal, i.e., which has applied with the chorus effect.

DELAY PROCESS

Figure 33:
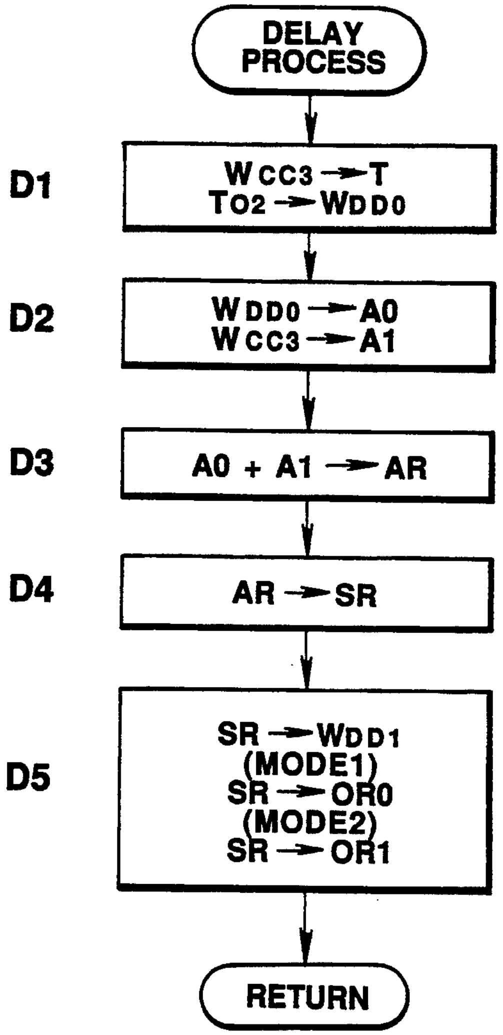
FIG. 33 is a flow chart showing detailed contents of a delay process.

The delay process will be described in detail with reference to the flow chart of FIG. 33.

In the present embodiment, the signal which has been applied with the chorus effect is to be subjected to the delay process so that the chorus output signal Wcc3 written at the address 6 of the work memory (W) 104 is subjected to the delay process.

At step D1, the chorus output signal Wcc3 is read out from the work memory (W) 104 and transferred to an address (01) of the delay memory 511. The chorus output signal Wcc3 which is delayed by a predetermined time by the delay memory 511 is written as a delayed output signal Wdd0 in the work memory (W) 104 at an address 7. In other words, the chorus output signal Wcc3 is transferred from the address (02) of the delay memory 511 to the address 7 of the work memory (W) 104. At the following step, the delayed output signal Wdd0 is read out from the work memory (W) 104 and transferred to the register (A0) 143 while the chorus output signal Wcc3 is read out from the work memory (W) 104 and transferred to the register (A1) 144. At step D3, the delayed output signal Wdd0 in the register (A0) 143 and the chorus output signal Wcc3 in the register (A1) 144 are transferred to the adder/subtractor 146, being subjected to an adding process. The resultant sum (Wdd0+Wcc3) is transferred to the register (AR) 151. The sum is transferred from the register (AR) 151 to the register (SR) 153 at step D4. The sum set in the register (SR) 153 is further transferred to and stored as the delayed output signal Wdd1 in work memory (W) 104 at an address 8 at step D5. The sum stored thus in the work memory (W) 104 is used in the process at step D2. At the same step D5, the sum set in the register (SR) 153 is transferred to the output register (OR0) 154 or to the register (OR1) 155 in accordance with the set mode or the setting of the program list changing routine process. More specifically, when the mode 1 has been set, the sum of the register (SR) 153 is transferred to the output register (OR0) 154 while when the mode 2 has been set, the sum is transferred to the output register (OR1) 155.

Through the delay process from step D1 to step D5, input signals are delayed by a predetermined time, being successively output. Which process should be executed on the signal subjected to the delay process is decided depending on which register, the output register (OR0) 154 or the output register (OR1) 155, the signal has been transferred to. More specifically, when the signal is transferred to the output register (OR0) 154, the signal is output as a final signal to D/A convertor 414 of FIG. 18 via the output terminal EO while when the signal is transferred to the output register (OR1) 155, the signal is output to the distortion circuit 417 via the output terminal A0, being subjected to the distortion process.

Since the mode 2 has been set in the present embodiment, the signal subjected to the delay process is transferred to the output register (OR1) 155, and is further output therefrom to the distortion circuit 417 through D/A convertor 415.

The distortion circuit 417 executes the distortion process on the supplied signal and then sends the signal to A/D convertor 415. The A/D convertor 415 converts the signal into a digital signal, inputting the same to the input terminal Ai of the DSP 413. In the analog input process, which will be described below, it is decided an area in the work memory (W) 104 in which the signal input to the input terminal Ai be written in accordance with the set mode.

Analog Input Process

Figure 34:
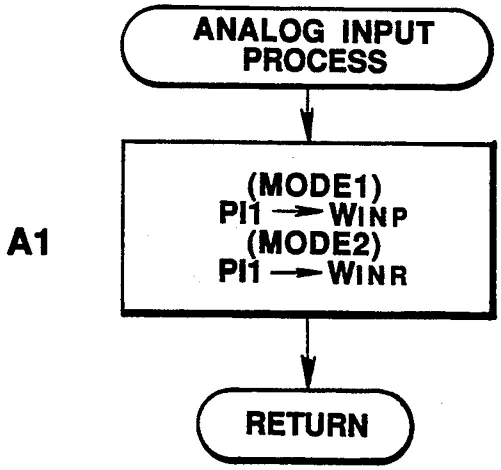
FIG. 34 is a flow chart showing detailed contents of an analog input process.

Now, the analog input process will be described in detail with reference to the flow chart of FIG. 34.

The analog input process is to decide which effect adding process DSP 413 should perform on the signal which has been subjected to the distortion process as the effect adding process to be executed in analog fashion by the distortion circuit 417. The analog input process decides an area in the work memory (W) 104 in which a signal is written.

More specifically, the input signal transferred from the distortion circuit 417 to the input terminal Ai through A/D convertor 412 is set to the input register (PI1) 122. The program list changing routine process decides an area in the work memory (W) 104 in which the input signal set in the input register (PI1) 122 is to be written. When the mode 1 has been set, the input signal set in the input register (PI1) 122 is written as an input signal Winp in the work memory (W) 104 at an address 0 at step A1. When the mode 2 has been set, the input signal set in the input register (PI1) 122 is written as an input signal Winr in the work memory (W) 104 at an address 1 at the same step A1. When the input signal is written in the work memory (W) 104 as the input signal Winp, the input signal is processed to be subjected to the chorus process. When the input signal is written in the work memory (W) 104 as the input signal Winr, the input signal is processed to be subjected to the reverberation process. Since it is assumed in the present embodiment that the mode 2 has been set, the input signal set in the input register (PI1) 122 is written as the input signal Winr in the work memory (W) 104, and is to be subjected to the reverberation process.

Reverberation Process

The reverberation process will be described in detail with reference to the flow charts of FIGS. 35 to 40.

Figure 35:
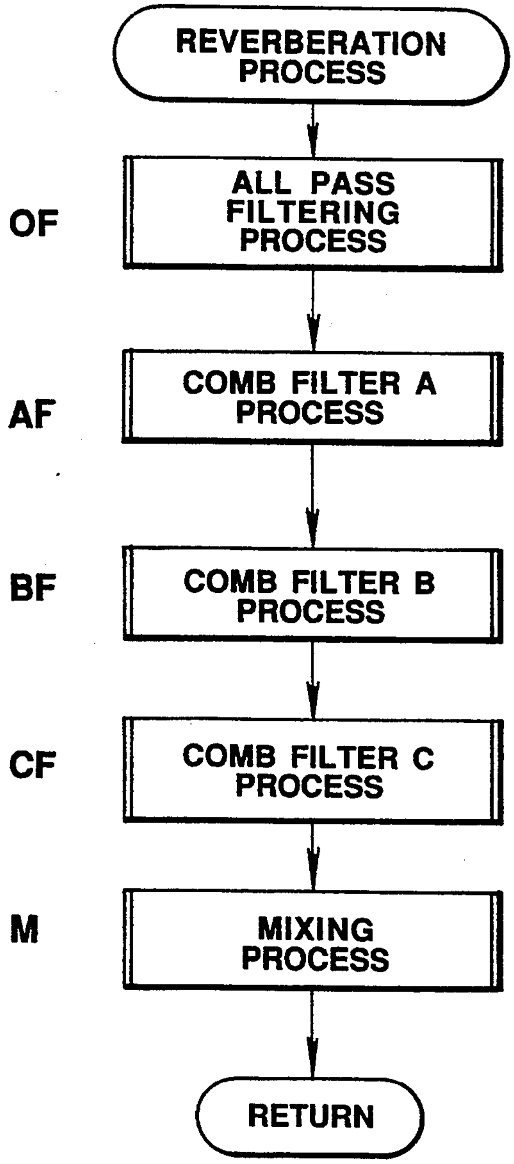
FIG. 35 is a flow chart showing detailed contents of a reverberation process.

In the reverberation process as shown in FIG. 35, an (steps OF), comb filter A process (steps AF), comb filter B process (step BF), comb filter C process (step CF) and mixing process (steps M) are successively executed. Now, these processes will be described in detail.

Figure 36:
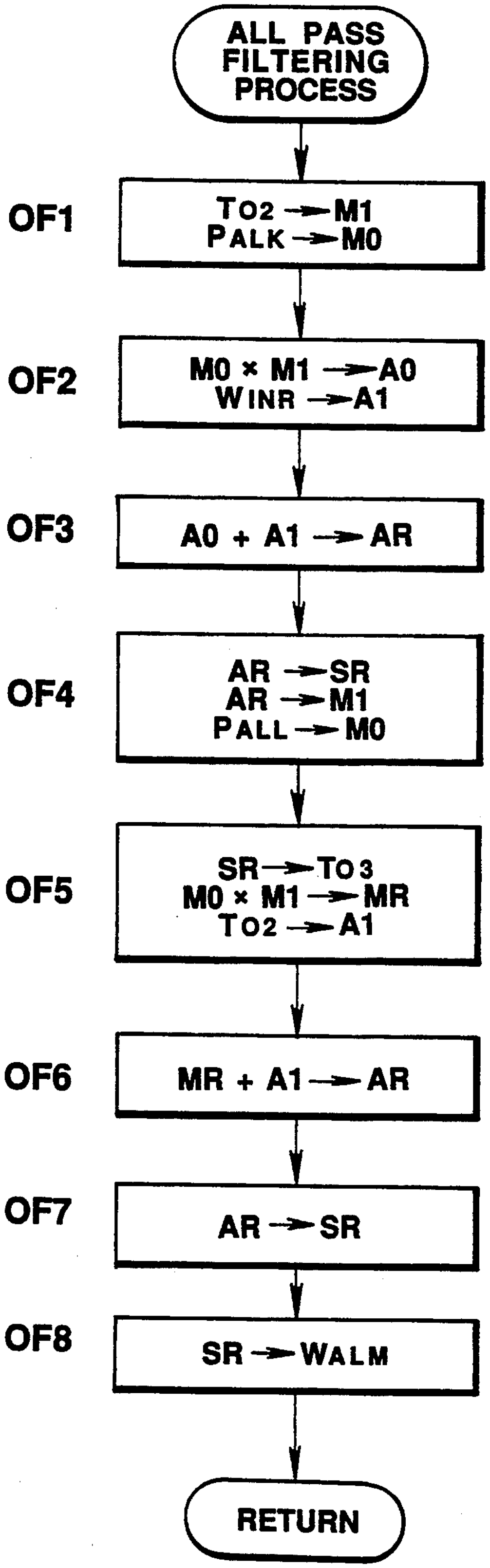
FIG. 36 is a flow chart showing detailed contents of an all pass filtering process.

The all pass filtering process will be described with reference to the flow chart of FIG. 36.

The all pass filtering process corresponds to that executed by the all pass filtering process unit 450 of FIG. 21. At step OF1, a signal which has been delayed by a predetermined time T02 is transferred from the delay memory 511 to the register (M1) 142, that is, a signal stored in the delay memory 511 at an address (02) is transferred to the register (M1) 142. At the same step OF1, an all pass filter coefficient Palk is read out from the coefficient memory (P) 103 and is transferred to the register (M0) 141. At the following step OF2, the signal of the register (M1) 142 and the all pass filter coefficient Palk of the register (M0) 141 are transferred to the multiplier 145, being subjected to a multiplying process. The resultant product is transferred to the register (A0) 143. Further, the input signal Winr is read out from the work memory (W) 104 and transferred to the register (A1) 144. At the following step OF3, the product set to the register (A0) 143 and the input signal Winr in the register (A1) 144 are transferred to the adder/subtractor 146 and are added to each other. The resultant sum is transferred to the register (AR) 151. At step OF4, the sum is transferred from register (AR) 151 to the register (SR) 153 and the sum set in the register (AR) 153 is transferred to the register (M1) 142 in the multiplying unit. Further, an all pass filtering coefficient Pall is read out from the coefficient memory (P) 103 and transferred to the register (M0) 141. At the following step OF5, the sum obtained at step OF3 and set in the register (SR) 153 is transferred to an address (03) of the delay memory 511. Further, the sum set in the register (M1) 142 and the all pass filter coefficient Pall set in the register (M0) 141 are transferred to the multiplier 145, being subjected to a multiplying process. The resultant product is transferred to the register (MR) 150. At the same step OF5, the signal which has been delayed by a predetermined time is transferred from the address (02) of the delay memory 511 to the register (A1) 144.

After the product and the delayed signal have been set to the register (MR) 150 and the register (A1) 144 respectively, the product of the register (MR) 150 and the delayed signal of the register (A1) 144 are transferred to the adder/subtractor 146 at step OF6, being subjected to an adding process. The resultant sum is transferred to the register (AR) 151. The resultant sum is further transferred to the register (SR) 153 at step OF7. At the following step OF8, the resultant sum is further transferred from the register (SR) 153 to the work memory (W) 104 and is written as an all pass filter output signal Walm at an address 9. Through the above processes, the signal which has been subjected to the all pass filtering process will be written as the all pass filter output signal Walm in the work memory (W) 104.

The signal which has been subjected to the all pass filtering process as described above is supplied to the comb filter A 460, the comb filter B 470 and the comb filter C 480, being subjected to respective comb filter processes as shown in FIG. 21. Actually, the work memory (W) 104 is used for performing these comb filter processes on the signal.

Figure 37:
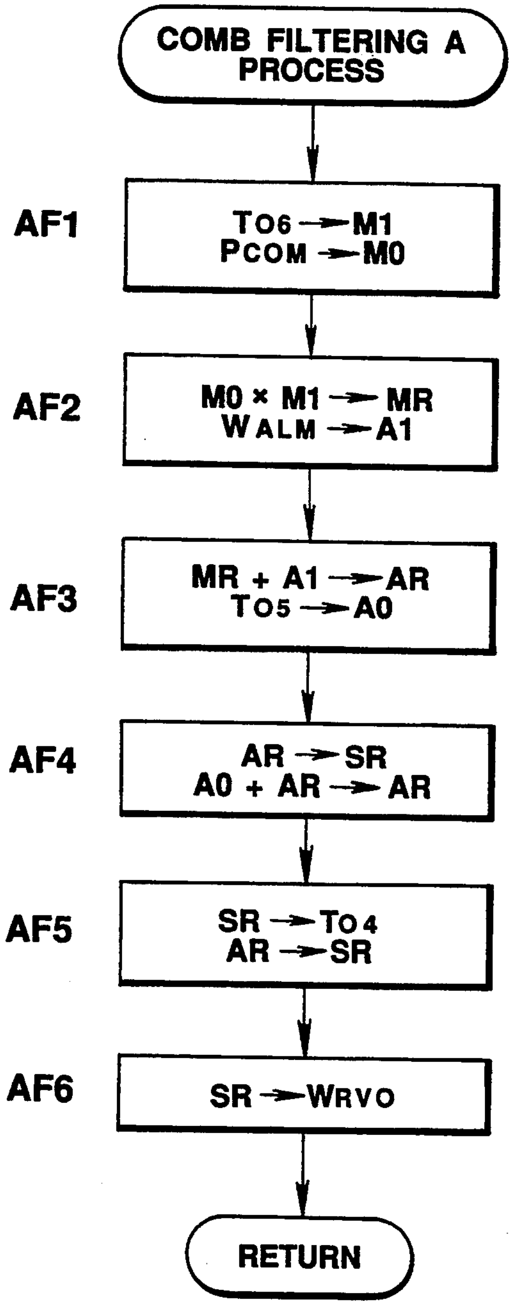
FIG. 37 is a flow chart showing detailed contents of a comb filter A process.

Now, the comb filter A process will be described with reference to the flow chart of FIG. 37.

At step AF1 of the comb filtering A process delay-processed signal T06 which is delayed by a predetermined time is transferred from the address (06) of the delay memory 511 to the register (M1) 142, and a comb filtering coefficient Pcom is read out from the coefficient memory (P) 103 and transferred to the register (M0) 141. At the following step AF2, the delay-processed signal TO6 of the register (M1) 142 and the comb filtering coefficient Pcom of the register (M1) 142 are transferred to the multiplier 145, being subjected to a multiplying process. The resultant product is transferred to the register (MR) 150. Further, the all pass filter output signal Walm is read out from the work memory (W) 104 and transferred to the register (A1) 144. At step AF3, the product of the register (MR) 150 and the all pass filter output signal Walm of the register (A1) 144 are transferred to the adder/subtractor 146, being subjected to an adding process. The resultant sum is transferred to the register (AR) 151, and the delay-processed signal TO5 which has been delayed by a predetermined time is transferred from the address (05) of the delay memory 511 to the register (A0) 143.

At step AF4, the sum of the register (AR) 151 is transferred to the register (SR) 153, and the sum and the delay-processed signal T05 of the register (A0) 143 are transferred to the adder/subtractor 146, being subjected to an adding process. The resultant sum is transferred to the register (AR) 151. At the following step AF5, the sum obtained at step AF3 and set in the register (SR) 153 at step AF4 is transferred as a delay-processed signal T04 to an address (05) of the delay memory 511. Further, the sum set in the register (AR) 151 is transferred to the register (SR) 153. At step AF6, the sum which has been obtained at step AF4 and transferred to the register (SR) 153 is transferred to the work memory (W) 104 and is written as a comb filter A output signal Wrv0 at an address 10.

Figure 38:
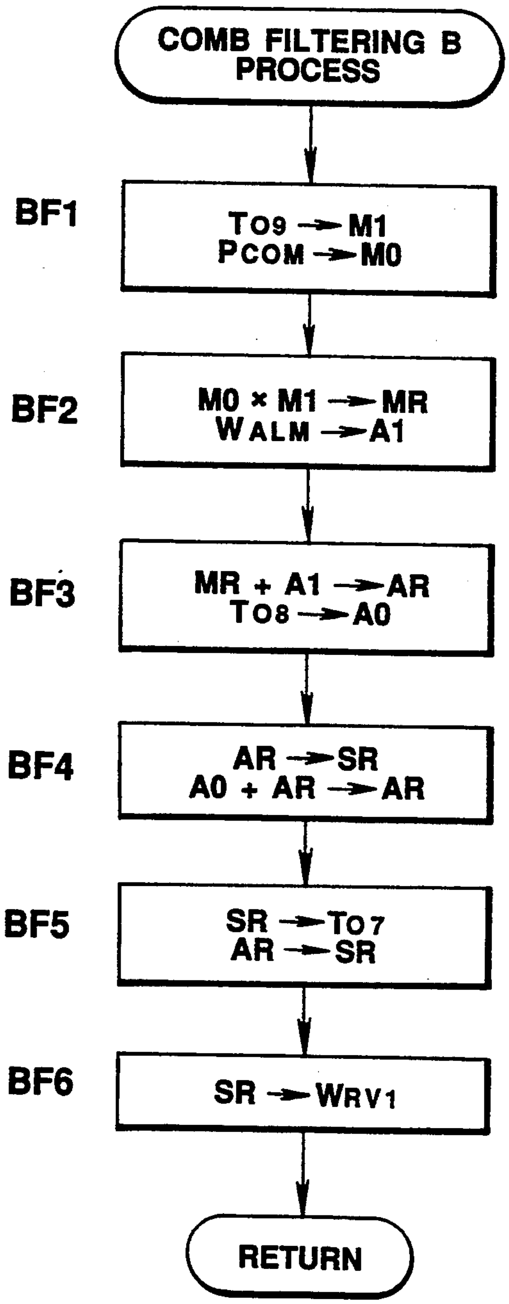
FIG. 38 is a flow chart showing detailed contents of a comb filter B process.
Figure 39:
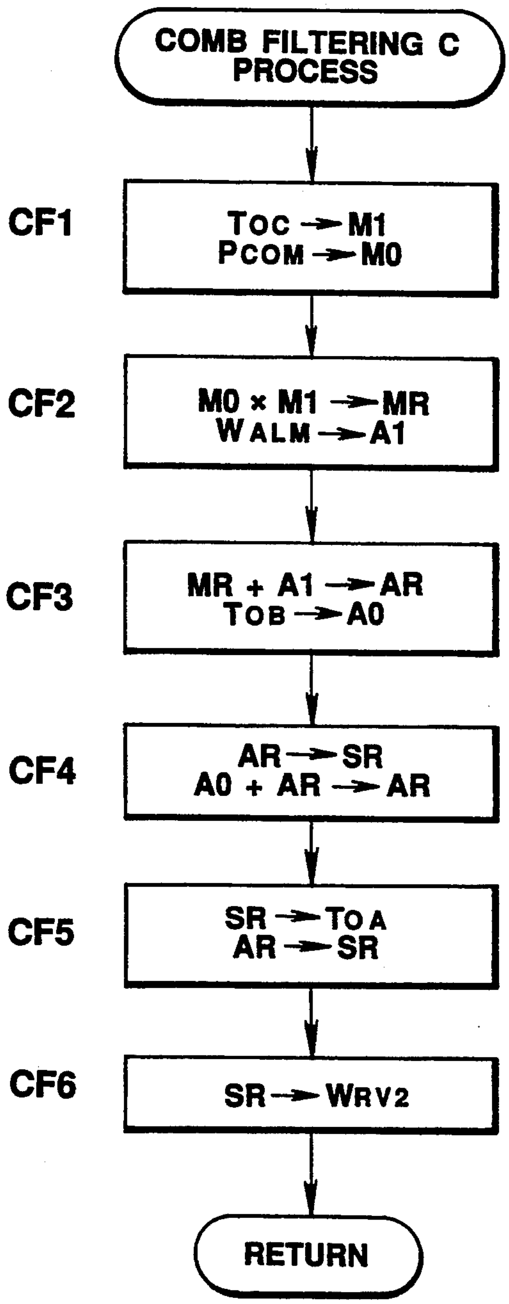
FIG. 39 is a flow chart showing detailed contents of a comb filter C process.
Figure 40:
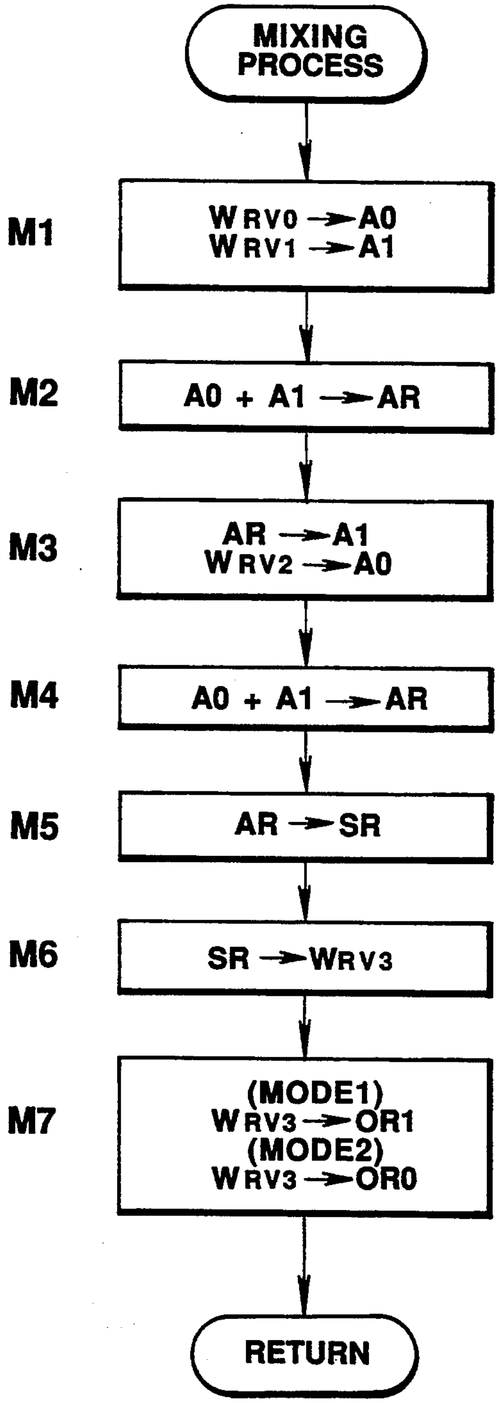
FIG. 40 is a flow chart showing detailed contents of a mixing process.

The comb filter B process and comb filter C process are performed in a similar manner to that of the comb filter A process, as shown in FIGS. 38 and 39. The resultant signal of the comb filter B process is written as a comb filter B output signal Wrv1 in the work memory (W) 104 at an address 11 while the resultant signal of the comb filter C process is written as a comb filter C output signal in the work memory (W) 104 at an address 12.

The resultant signals of the respective comb filter processes are written in the work memory (W) 104 as described above, and then these signals are subjected to the mixing process.

In the mixing process, at step M1, the comb filter A output signal Wrv0 is read out from the work memory (W) 104 and is transferred to the register (A0) 143, and the comb filter B output signal Wrv1 is read out from the work memory (W) 104 and is transferred to the register (A1) 144. At step M2, the comb filter A output signal Wrv0 in the register (A0) 143 and the comb filter B output signal Wrv1 in the register (A1) 144 are transferred to the adder/subtractor 146, being subjected to an adding process. The resultant sum is transferred to the register (AR) 151. At the following step M3, the resultant sum is further transferred to the register (A1) 144, and the comb filter C output signal Wrv2 is read out from the work memory (W) 104 and transferred to the register (A0) 143. At step M4, the sum of the register (A1) 144 and the comb filter C output signal Wrv2 of the register (A0) 143 are transferred to the adder/subtractor 146, being subjected to an adding process. The resultant sum is transferred to the register (AR) 151. At the following steps M5 and M6, the resultant sum is transferred through the register (SR) 153 to work memory (W) 104 and is written as a reverberation output signal Wrv3 at an address 13 of the work memory (W) 104.

The output register where the reverberation output signal Wrv3 set in the work memory (W) 104 is to be written is decided in accordance with the program list changing routine process at step M7. More specifically, when the mode 1 has been set, the reverberation output signal Wrv3 is read out from the work memory (W) 104 and is transferred to the output register (OR1) 155 while when the mode 2 has been set, the reverberation output signal Wrv3 is read out from the work memory (W) 104 and is transferred to the output register (OR0) 154. The reverberation output signal Wrv3 transferred to the output register (OR1) 155 is output to D/A convertor 415 via the output terminal A0, and further is transferred therefrom to the distortion circuit 417, being subjected to the distortion process. Meanwhile, the reverberation output signal Wrv3 transferred to the output register (OR0) 154 is output to D/A convertor 414 via the output terminal E0, being converted into an analog signal. The analog signal is output as the final output signal to the tone control unit 405 of FIG. 17. The present embodiment has been set to the mode 2, and the reverberation output signal Wrv3 therefore is read out from the work memory (W) 104 and is transferred to the output register (OR0) 154. The reverberation output signal Wrv3 is further output as the final output signal to D/A convertor 414 via the output terminal E0.

As described above, not only the order in which a plurality of digital effect adding processes are performed on an input signal by DSP 413 may be altered by changing the area in the work memory (W) 104 where the input signal is stored, but also the order in which the effect adding process by DSP 413 and the analog effect adding process by the distortion circuit 417 are performed may be altered properly. That is, the order in which the digital effect adding process and the analog effect adding process are performed may be altered without changing a physical connection of the DSP 413 and the distortion circuit 417. As a consequence, musical tones which are richer in expression may be generated.

The embodiments have been described above, in which sound effect adding processes such as the reverberation process, chorus process and delay process are performed by DSP 413, and the chorus process and the delay process are continuously performed. The sound effect adding processes performed by DSP 413, however, are not limited to the above mentioned processes, and other processes may be performed.

In the above embodiments, the distortion process is executed as an analog effect adding process but other process may be executed as the analog effect adding process.

Although the several embodiments of the present invention have been described, these embodiments are simply illustrative and not restrictive. The present invention may be modified in various manners. All the modification and applications of the present invention are within the scope and spirit of the invention, so that the scope of the invention should be determined only by what is recited in the appended claims and their equivalents.

What is claimed is:

1. An effect adding apparatus comprising:

analog-effect adding means for applying a sound effect to an input audio signal using an analog element;

input memory means having a plurality of memory areas, for storing the input audio signal and a signal output from said analog-effect adding means in relevant memory areas respectively;

digital-effect adding means for applying through a digital process a sound effect to the signal stored in one of the memory areas of said input memory means;

output memory means having a memory area for storing the signal output from said digital-effect adding means as an input signal to said analog-effect adding means and having a memory area for storing the signal output from said digital-effect adding means as a final output signal; and designating means for designating a memory area in said input memory means where a signal to be input to said digital-effect adding means is stored, and designating a memory area in said output memory means where the signal output from said digital-effect adding means is to be stored.

2. An effect adding apparatus according to claim 1, wherein said analog-effect adding means applies a distortion effect to the input audio signal to distort the same.

3. An effect adding apparatus according to claim 1, wherein said digital-effect adding means comprises digital signal processing means for performing an arithmetic process on the input audio signal in accordance with a previously stored program and outputting the processed audio signal.

4. An effect adding apparatus according to claim 1, wherein said digital-effect adding means applies a plurality of sound effects to the input audio signal.

5. An effect adding apparatus according to claim 4, wherein the plurality of sound effects include a chorus effect, delay effect and reverberation effect.

6. An effect adding apparatus comprising:

effect-algorithm memory means for storing a plurality of effect-algorithms for applying different digital sound effects to an input audio signal;

analog-effect adding means for applying an analog effect to an input audio signal using an analog element;

combination-data memory means for storing a plurality of combination-data which represent combinations in different states of effect-algorithms and the analog effect, the effect-algorithms being stored in said effect-algorithm memory means and the analog effect being to be applied to the input audio signal by said analog-effect adding means;

program writing means for reading out a combination-data from said combination-data memory means, then selectively reading out relevant effect-algorithms from said effect-algorithm memory mean in accordance with the read out combination-data, and writing a program representative of an order in which the digital effects based on the read out effect-algorithms and the analog effects by said analog-effect adding means are added;

signal memory mean for storing the input audio signal;

digital-effect adding means for applying relevant digital sound-effects to the audio signal stored in said signal memory means when an application of the digital sound-effects based on the effect-algorithm is instructed in accordance with the program written by said program writing means;

control means for inputting the audio signal stored in said signal memory means to said analog-effect adding means and allowing an output signal of said analog-effect adding means to be stored again in said signal memory means, when an application of the analog effect is instructed in accordance with the program written by said program writing; and output means for outputting the audio signal stored in said signal memory means upon detection of completion of an application of the sound-effects to the audio signal in accordance with the program.

7. An effect adding apparatus according to claim 6, wherein said effect-algorithm memory means and said combination-data memory means are included in one and the same readable memory means.

8. An effect adding apparatus according to claim 6, wherein said digital effect adding means comprises program memory means for storing a program written by said program writing means and digital signal processing means for performing an arithmetic process on the input audio signal in accordance with the program stored in said program memory means.

9. An effect adding apparatus according to claim 6, wherein said program writing means comprises central processing means for reading out a combination-data from said combination-data memory means and effect-algorithms from said effect-algorithm memory means, and for writing one program based on the read out combination-data and the read out effect-algorithms.

10. An effect adding apparatus according to claim 6, wherein said program writing means includes externally operable means, wherein a combination-data and effect-algorithms are selected from among those stored in said combination-data memory means and said effect-algorithm memory means in accordance with operation of said externally operable means.

11. An effect adding apparatus according to claim 6, wherein said analog-effect adding means applies a distortion effect to the input audio signal to distort the same.

* * * * *